US 6,563,565 B2

(12) United States Patent
Nishi

(10) Patent No.: US 6,563,565 B2
(45) Date of Patent: May 13, 2003

(54) APPARATUS AND METHOD FOR PROJECTION EXPOSURE

(75) Inventor: Kenji Nishi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/784,084

(22) Filed: Feb. 16, 2001

(65) Prior Publication Data

US 2001/0010579 A1 Aug. 2, 2001

Related U.S. Application Data

(63) Continuation of application No. 09/139,019, filed on Aug. 24, 1998, now abandoned.

(30) Foreign Application Priority Data

Aug. 27, 1997 (JP) .............................. 9-230722

(51) Int. Cl.[7] ...................... G03B 27/42; G03B 27/54; G03B 27/72
(52) U.S. Cl. .............................. 355/53; 355/67; 355/71
(58) Field of Search .............................. 355/52, 53, 55, 355/67–71, 77; 250/548, 492.2, 492.22; 356/399–401

(56) References Cited

U.S. PATENT DOCUMENTS

| 5,117,255 | A | | 5/1992 | Shiraishi ...................... 355/53 |
|---|---|---|---|---|
| 5,191,374 | A | | 3/1993 | Hazama et al. ............... 355/43 |
| 5,309,198 | A | | 5/1994 | Nakagawa .................... 355/67 |
| 5,473,412 | A | | 12/1995 | Ozawa ........................ 355/77 |
| 5,559,584 | A | | 9/1996 | Miyaji et al. ................. 355/73 |
| 5,581,324 | A | * | 12/1996 | Miyai et al. .................. 355/53 |
| 5,644,383 | A | | 7/1997 | Mori ........................... 355/68 |
| 5,646,413 | A | | 7/1997 | Nishi .......................... 250/548 |
| 5,661,548 | A | * | 8/1997 | Imai ............................ 355/55 |
| 5,781,277 | A | | 7/1998 | Iwamoto ...................... 355/53 |
| 5,798,838 | A | * | 8/1998 | Taniguchi et al. ........... 356/401 |
| 5,879,845 | A | * | 3/1999 | Takahashi .................... 430/30 |
| 5,892,573 | A | | 4/1999 | Takahashi et al. ............ 355/69 |
| 5,894,341 | A | * | 4/1999 | Nishi et al. .................. 355/68 |
| 5,898,477 | A | | 4/1999 | Yoshimura et al. ........... 355/53 |
| 5,965,308 | A | | 10/1999 | Ozawa ........................ 430/30 |

FOREIGN PATENT DOCUMENTS

| EP | 1 014 197 A2 | 6/2000 |
|---|---|---|
| JP | A-5-343288 | 12/1993 |
| JP | A-6-204113 | 7/1994 |
| JP | A-6-260385 | 9/1994 |
| JP | A-10-116766 | 5/1998 |

* cited by examiner

Primary Examiner—Henry Hung Nguyen
(74) Attorney, Agent, or Firm—Oliff & Berridge PLC

(57) ABSTRACT

A projection exposure apparatus is able to monitor changes in transmissivity of the projection optical system so as to provide a high degree of control over the exposure illuminance to produce precision printing of circuit patterns on a substrate. A referencing member, having reference marks and a window section for determining the illuminance of the transmitting exposure beam, is provided on the sample stage for the substrate. During scanning/exposure process, any positional deviation of projection optical system is checked by the alignment system by comparing reticle marks on the reticle with reference marks on the sample stage illuminated with alignment beams. Simultaneously, illuminance of exposure light passing through the projection optical system is checked to determine if there is any change in the transmission coefficient of the optical system, and illumination power is adjusted to provide near real-time compensation for any change in transmissivity in the optical system.

47 Claims, 12 Drawing Sheets

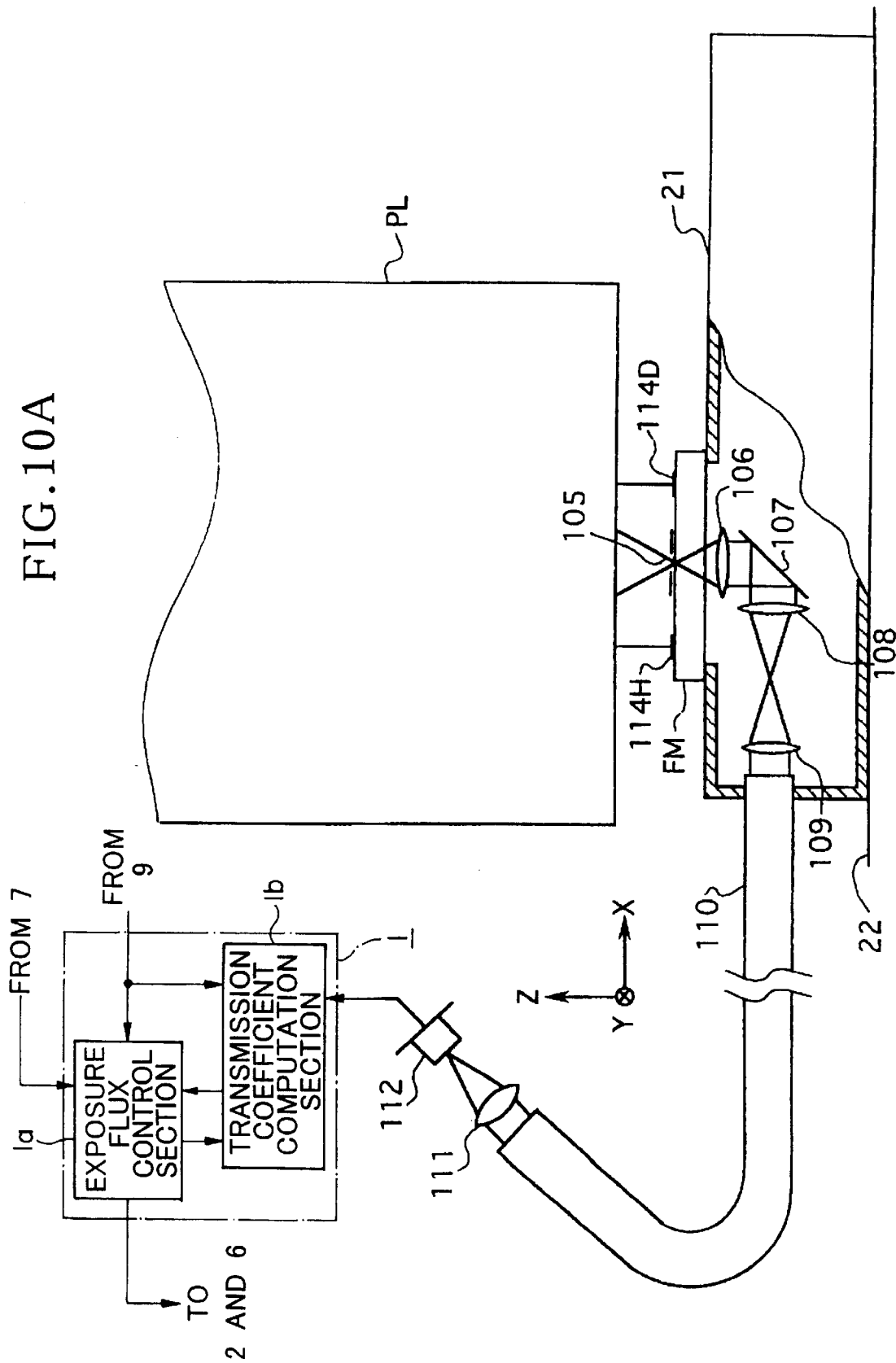

APPARATUS AND METHOD FOR PROJECTION EXPOSURE

This is a Continuation of application Ser. No. 09/139,019 filed Aug. 24, 1998 abandoned. The entire disclosure of the prior application is hereby incorporated by reference herein in its entirety.

BACKGROUND OF THE INVENTION

1. Field of the Invention

The present invention relates to an apparatus and a method for an exposure technique in the photolithographic process, such as projecting a pattern through a projection optical system and transferring the pattern on a substrate, to manufacture advanced solid state devices such as semiconductor elements, image pick-up devices (e.g. CCD), liquid crystal display elements and thin film magnetic heads.

2. Background Art

Photographic exposure technology constitutes a nucleus of semiconductor device fabrication, and as the device circuits become more highly integrated, it becomes crucial to improve resolution capability and transfer fidelity of images produced in the optical systems. Typical photolithographic process involves such steps as application of a resist film on a substrate, exposure and development of the resist patterns. To improve image resolution and transfer fidelity, it is critical to provide a precise control over the exposure dose for an optimal degree of exposure of the photo-resist film applied to a wafer as the substrate.

Conventionally, a general practice in semiconductor fabrication plants has been to use, as exposure light, i-line of wavelength at about 365 nm produced by a mercury lamp, in a so-called step-and-repeat exposure arrangement including a stepper for image projection at an image reduction ratio of ⅕ from the reticle to the wafer. In recent years, as larger size wafers have become more common, the size of the projected pattern image have also increased, but in order to avoid excessively large projected image size, a different technique of exposure is receiving attention. This technique is called step-and-scan method, which involves a movable reticle within the field of view of the object plane in a certain direction at a constant speed, and a corresponding movable wafer within the field of view of the image plane to be moved at the same relative speed as the reduction ratio so that the overall image of a circuit pattern on the reticle can be transferred onto each region of the wafer surface.

In the conventional methods of exposure dose control, it is assumed that the transmission coefficient of a projection optical system with respect to an illumination light does not vary in the short period involved in an exposure process, so that a light meter on the wafer stage is considered to be adequate for exposure control purposes. For example, exposure on the wafer surface is determined by measuring the transmission coefficient of the projection optical system just prior to the exposure event, measuring the quantity of illumination light in a branched path of the illumination optical system, and computing the exposure necessary according to the measured values of transmission coefficient and illumination dose. In the stepper system which is static, exposure duration is controlled so that the accumulated value of the calculated amount of exposure dose will reach a certain value, and in a scanning system which is dynamic, the output power or scanning speed is controlled so as to maintain the calculated quantity of exposure dose (for a given illuminance) at a constant value.

In recent years, there has been a trend towards using shorter wavelengths for the exposure light to improve the optical resolution, such that ultraviolet light from an excimer laser source is used in some step-and-repeat and step-and-scan apparatus. There is a serious move in some production lines to use a KrF excimer laser emitting at 248 nm, and there has been promising developments for wavelengths shorter than 200 nm, such as ArF excimer lasers generating ultraviolet pulses at 193 nm.

However, ultraviolet pulses produced from ArF excimer laser contain several oxygen absorption bands within the wavelength band in their natural oscillation states, such that, to use the laser as an exposure pulse source, it is desirable to restrict the light spectrum to a wavelength band that avoids such absorption bands. Furthermore, it is desirable that the illumination path (between light source and reticle) and the projection path (between reticle and wafer) be as free of oxygen gas as possible, in other words, it is desirable that most of the illumination path and projection path be surrounded by an inert gas environment (nitrogen or helium gas). Examples of projection exposure apparatuses based on such an ArF excimer laser light source have been disclosed in Japanese Patent Applications, First Publications, Hei 6-260385 and Hei 6-260386 (corresponding to U.S. Pat. No. 5,559,584).

Presently, there are only two optical grade materials available commercially that are known to produce a relatively high transmission for such ultraviolet pulses generated by excimer lasers (especially for wavelength shorter than 200 nm); they are quartz ($SiO_2$) and fluoro spar or fluorite ($CaF_2$). Other such materials include magnesium fluoride and lithium fluoride, but for use as optical material for projection exposure apparatus, there are still unresolved problems of fabricability and durability.

Other associated concerns are optical projection systems for use in projection exposure apparatus. There are dioptric system (refractive) and cata-dioptric systems which combine refractive elements (lenses) with reflective elements (specially concave mirror). Regardless of which type of projection system is used, if refractive elements (transmissive elements) are involved in some parts of the system, one is forced to use at least one of either quartz or fluorite, at the present time. Furthermore, whether refractive or reflective, these optical components are used with multilayers of vapor-deposited surface coatings such as anti-reflection or protective coatings, and they are manufactured to fulfill custom specifications of certain optical components. The particular property of interest in this case is the magnitude of absolute transmissivity of lenses or absolute value of reflectivity of the optical elements made from these optical materials.

For example, for a single lens element, incident surface and exiting surface are generally both coated with anti-reflection coating so as to increase transmissivity as much as possible. In precision imaging systems such as projection exposure apparatus, there are twenty to thirty lenses to provide compensation for various aberration effects, such that, even if the transmissivity of each lens element is only slightly less than 100%, the overall transmissivity of the projection system is decreased considerably. Same is true for a projection exposure apparatus using some reflective elements so that if each reflective element has low reflection, the overall transmission of the projection system is decreased greatly.

For example, if there are twenty-five lens elements in the focusing path of the projection system, if each lens has a transmission coefficient of 96%, the overall transmission coefficient $\epsilon$ becomes fairly small at about 36% ($\approx 0.96^{25} \times$ 100). When the transmission coefficient of the projection system is low, it is necessary to either increase the luminocity (energy) of exposure light for projecting the circuit pattern on the reticle on the wafer, or use a ultraviolet-sensitive photoresist of higher sensitivity, otherwise the longer exposure required would reduce productivity. Therefore, practical solution for the projection exposure apparatus is to use an excimer laser of higher output power.

However, as trials progressed using such excimer lasers having relatively larger projected field size, a new phenomenon was discovered that, in relatively short time, the transmission coefficient of coating materials on the optical elements (e.g., anti-reflection coating) underwent dynamic changes due to the use of ultraviolet pulses (from KrF or ArF excimer lasers). It has been discovered since that the same phenomenon can occur not only on optical elements in the projection path but also on those in the illumination path for reticle (quartz plate) as well as on the reticle itself.

Such a phenomenon is considered to occur because the performance of optical components are affected by the impurity effects, such as particles adhering to the optical surface or particles floating in the optical paths. Such impurity particles may occur naturally in the gas present in the space in the projection path or illumination path (air, nitrogen gas and the like), or they may be organic molecules generated from adhesives used to cement optical elements to the lens barrel, or they may be impurities (such as water and carbohydrate molecules, or other light dispersive substances) released from inside surfaces of the lens barrel (anti-reflection coating). The result is that operational difficulties are caused by relatively large variations in the transmission coefficient of projection system or illumination system. Such difficulties are a result of decrease in the transmission coefficient due to adhesion of particles but, conversely, they can also be caused by vaporization of materials on the surface of optical elements by strong ultraviolet irradiation to result in increasing their transmission coefficient. Whether the transmission coefficient would be decreased or increased by impurity effects is dependent on a number of system configuration factors such as the position of the optical elements, method of attachment and the nature of the gas surrounding the elements.

For example, in the above example of a 25-lens projection system having a transmission coefficient $\epsilon$ of 36%, if the transmission coefficient of each lens is decreased by 1%, the overall transmission coefficient $\epsilon$ of the system drops to about 27.7% ($\approx 0.95^{25} \times 100$).

Such a variation in transmissivity would interfere with providing an optimum exposure dose at the wafer, accompanied by a danger of degradation in the transfer fidelity of fine patterns of design line widths of the order of 0.18~0.25 $\mu$m. As disclosed in a Japanese Patent Application, First Publication, Hei 2-135723 (corresponding to U.S. Pat. No. 5,191,374), conventional projection exposure apparatus typically relies on measuring the optical power at a given point in the illumination path of the system, and, based on the measurement results, adjusts the pulse power (energy per pulse) of the pulses generated from the excimer laser to arrive at an optimum exposure level. For this reason, the existing method does not consider the effects of variance in transmissivity in the illumination and projection paths, past the monitoring point in the illumination path, thus leading to inaccurate estimate of exposure dose control. Furthermore, such variations in the transmission coefficient of the system is likely to lead to changes in optical property of the projection optical system.

It has further been found that, when irradiation of ultraviolet pulses is stopped, the system exhibits a phenomenon of gradual recovery (change) of transmission coefficient. In such a case, upon resuming exposure by ultraviolet pulse radiation, there is a danger of improper exposure caused by undetected changes in the system transmission coefficient that have taken place in the projection exposure apparatus.

SUMMARY OF THE INVENTION

It is a first object of the present invention to provide a projection exposure apparatus that enables to accurately update the changes in the transmission coefficient of the system during the exposure process.

It is a second object of the present invention to provide a projection exposure apparatus that prevents a degradation in exposure dose on the substrate, caused by changes in illuminance (or pulse energy variation) at the substrate brought about by changes in the system transmission coefficient.

It is also an object of the present invention to provide a method of operating the projection exposure apparatus of the present invention.

The first projection exposure apparatus having an illumination optical system for emitting an energy beam, for example, of wavelengths in an ultraviolet region, and illuminating a pattern formed on mask, a projection optical system for projecting an image of the pattern onto a substrate and a substrate stage for positioning the substrate; is comprised by: a beam energy measuring system for measuring input energy of the energy beam input in the projection optical system; a referencing member, fixedly disposed on the substrate stage, having a plurality of reference marks, to correspond with alignment marks formed on the mask, and a window section for transmitting or reflecting the energy beam; a detector device for detecting illuminance of the energy beam passing through the window section; an alignment sensor for detecting a positional deviation between the alignment marks and the reference marks; and a computation system for computing a transmission coefficient of the energy beam through the projection optical system, according to result output from the beam energy measuring system and detection result output from the detector device.

Accordingly, the present scanning exposure apparatus allows quick checking of transmissivity of the system, during exchanging of mask or substrate for example, to track any change in the optical integrity of the system. The alignment sensor is used to measure a positional deviation between the alignment mark on the masking device and the reference mark on the referencing member to check misalignment of the masking device with respect to the substrate stage. Nearly simultaneously, exposure dose passing through the window section is measured by the detector device to determine the exposure dose radiating on the substrate and the transmission coefficient through the projection optical system and the window section. Therefore, every time the wafer is exchanged or after a certain number of wafers have been exposed, it is possible to efficiently monitor system transmissivity by frequent computations of the system transmission coefficient, without having to provide a separate transmission measuring step.

Changes in the transmission coefficient thus monitored is used first to control the exposure dose at the target value. Further, the results can also be used to correct reflection coefficient measurement results from the substrate and for calibrating the sensor for checking the transmissivity of the projection optical system from outside the exposure region. Also, during preliminary setup adjustments of the apparatus, performance characteristics of transmission coefficient in the projection optical system (illumination history), can be determined as a function of cumulative exposure time, and at the time of production operation, expected change in the transmissivity of the apparatus may be corrected according to such a pre-determined function. In this case, higher precision of exposure control can be attained by successively correcting such function with measured actual change in the transmissivity during wafer exchange and other breaks in the process.

According to a second aspect of the present invention, the projection exposure apparatus having an illumination optical system for emitting an energy beam, for example, of wavelengths in an ultraviolet region and illuminating a pattern formed on mask, a projection optical system for projecting an image of the pattern onto a substrate and a substrate stage for positioning the substrate; is comprised by: a referencing member, fixedly disposed on the substrate stage, having a plurality of reference marks, to correspond with alignment marks formed on the mask, and a window section for transmitting or reflecting the energy beam; a detector device for detecting illuminance of the energy beam passing through the window section; an alignment sensor for detecting a positional deviation between the alignment marks and the reference marks; and a luminosity control system for controlling exposure dose radiating on the substrate from the illumination optical system through the projection optical system, according to result output from the detector device.

Accordingly, during exchanging of mask or substrate for example, the detector device is used to measure the exposure dose passing through the projection optical system. Therefore, illuminance at the wafer surface, which includes changes in transmissivity of the projection optical system, can be monitored accurately. Thus, by controlling the exposure dose according to the monitored results, degradation in exposure dose control, brought about by changes in illuminance (or pulse energy change) on the substrate caused by changes in transmission coefficient in the projection optical system, can be prevented.

An example of the energy beam is a pulse light of less than 200 nm wavelength, and a mask stage for moving the masking device is provided, and during a process of scanning exposure, the substrate and the mask are scanned under the projection optical system by translating the substrate stage synchronously with the mask stage. This arrangement means that the scanning exposure apparatus is an apparatus based on step-and-scan method.

A method of using the scanning exposure apparatus of the present invention includes a step in which, using the alignment sensor and nearly concurrently detecting a positional deviation of the alignment marks with respect to the reference marks, illuminance of the energy beam is determined in cooperation with the window section and the detector device. As explained already, transmissivity (transmitted exposure dose) can thus be tracked accurately without sacrificing productivity of the photolithographic production line.

BRIEF DESCRIPTION OF THE DRAWINGS

FIGS. 10A and 10B are, respectively, schematic views of a section of the transmitted light measuring system for the projection system.

DESCRIPTION OF THE PREFERRED EMBODIMENTS

Preferred embodiments will be presented in the following with reference to the drawings. The following embodiments are based on applying the present invention to a scanning projection exposure apparatus of step-and-scan type using a reflection/refraction type projection system.

Figure 1:
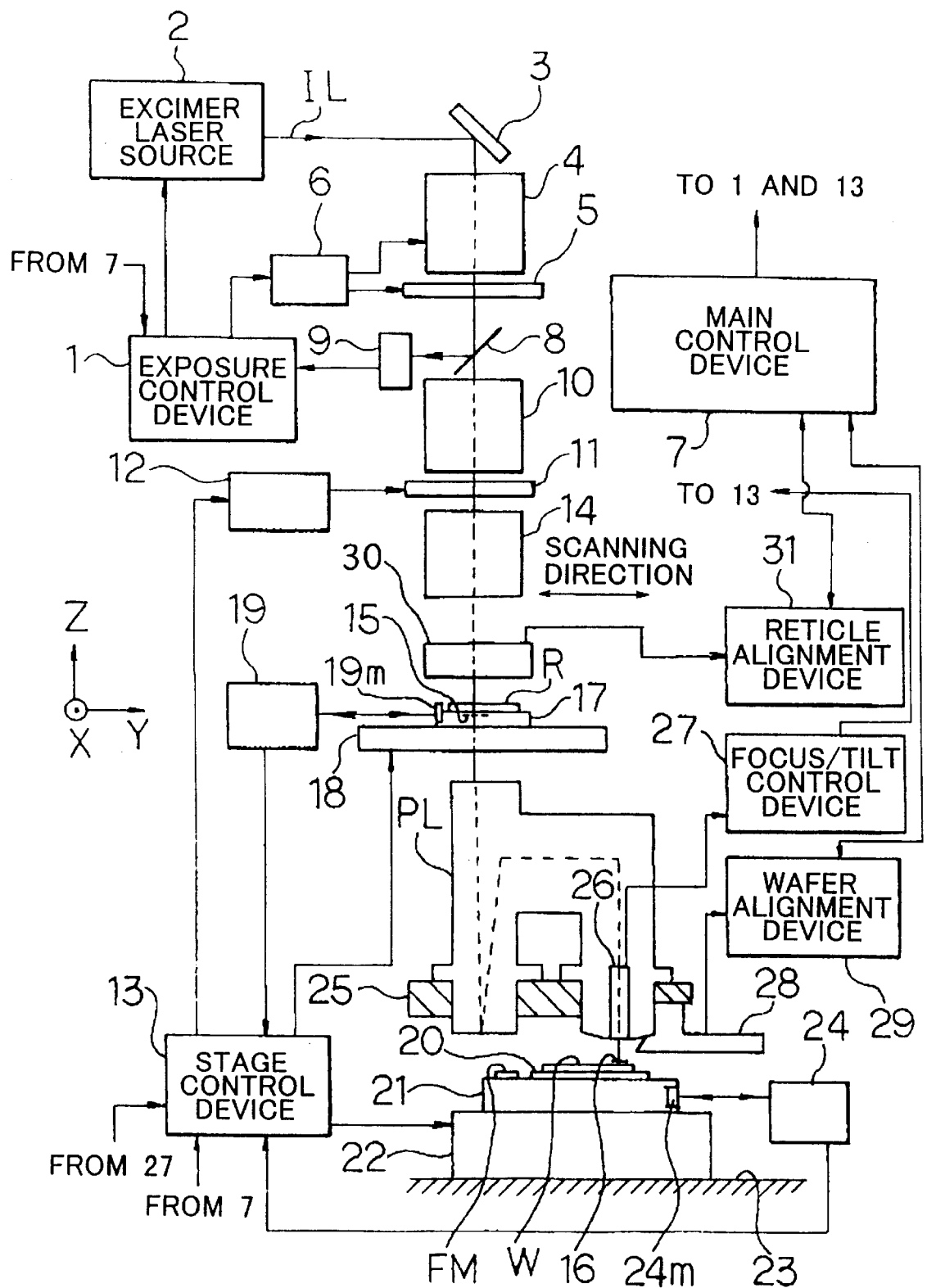
FIG. 1 is a schematic diagram of an embodiment of the projection exposure apparatus of the present invention.

FIG. 1 shows a schematic representation of the projection exposure apparatus of this embodiment. Ultraviolet pulses constituting an illumination beam IL from an excimer laser source 2 whose excitation level is controlled by an exposure control device 1 are radiated on and is deflected by a deflection mirror 3 and arrive at a first illumination system 4. The excimer laser source 2 in this embodiment is an ArF excimer laser to generate wideband pulses at 193 nm wavelength whose full-width-half-maximum (FWHM) value is made to be wider than 100 pico-meter (pm). However other laser types such as halogen molecular laser ($F_2$ laser) at 157 nm, or a harmonics generating YAG laser may also be used as the exposure light source; furthermore, if necessary, a light source which generates light except ultraviolet light may also be used. The light source may also be a narrow band type which is inferior to wideband lasers in terms of its output power but has an advantage that it does not require chromatic corrections.

The first illumination system 4 includes a beam expander, a variable optical power device, an illumination switching device for changing the luminosity of illumination light when the coherence factor (so-called σ value) is altered, and a fly-eye lens. A secondary light source is distributed in the plane of illumination light IL at the output surface of the first illumination system 4, and an aperture revolver 5 is disposed at the planar secondary light source for switching the apertures to vary the illumination conditions. Aperture revolver 5 is operated by a switcher device 6 to rotate to bring the various eccentric apertures, such as regular circular apertures, variable shape apertures, ring band type apertures and small circular apertures (σ aperture), under the output plane of the first illumination system 4. When the illumination aperture is switched, the first illumination system 4 is synchronized with the switcher device 6 to automatically adjust the illuminance to be at a highest value.

The operation of the switcher device 6 is controlled by the exposure control device 1 which is controlled by the main control device 7 so as to control the performance of the overall apparatus.

Illumination beam IL transmitted through the selected illumination aperture at the aperture revolver 5 enters a beam splitter 8, having high transmissivity and low reflectivity, and the reflected beam from the beam splitter 8 is received in an integrator sensor 9 comprised by such photodetecting devices as photodiodes and the like. Electrical signals obtained by conversion in the integrator sensor 9 is supplied to the exposure control device 1. The relation of the photonic signals to the exposure quantity is predetermined and stored in the memory. Exposure control device 1 monitors integrated exposure dose at the wafer according to the photonic signals. Photonic signals are also used to standardize output signals of various sensors which utilize the illumination beam IL, and in this embodiment, photonic signals from the integrator sensor 9 are used to monitor input energy of the illumination beam IL input into the projection system PL for exposure purposes. This will be explained fully later.

Illumination beam IL exiting the beam splitter 8 passes through a second illumination system 10 and illuminates a field of view illumination aperture (reticle blind system) 11 as a field stop. The plane of disposition of this field of view illumination aperture 11 is conjugate to the input plane of the fly-eye lens in the first illumination system 4, and the illuminated area of the aperture 11 is similar to the cross sectional shape of each element of the fly-eye lens. As is disclosed in the U.S. Pat. No. 5,473,410, field of view illumination aperture 11 is separated into a stationary blind and a movable blind, where the stationary blind is an aperture with a fixed rectangular opening and a movable blind is comprised by two pairs of operable blades which can be moved in the scanning direction or non-scanning direction. The fixed blind determines the shape and the size of illuminated region on the reticle, and the movable blinds are used to prevent illuminating areas other than the shot area (the targeted exposure area on the wafer) by gradually opening the shaded region created by the fixed blind at the time of initiating exposure or gradually closing the exposed area at the time of stopping the exposure. Further, the shape and the size of the fixed blind opening can be altered in such a way that, depending on the longitudinal location, the size of the shorter perimeter can be altered to correct non-uniform illumination on the wafer.

The activity of the movable blind of the field of view illumination aperture 11 is controlled by a blind driver 12, and, when performing scanning of the reticle and wafer under the control of a stage control device 13, the blind driver 12 will synchronously move the movable blind in the scanning direction. Illumination beam IL transmitted through the field of view illumination aperture 11 and a third illumination system 14 radiates on a rectangular illumination region 15 below the pattern surface (bottom surface) of the reticle R with uniform illuminance. The plane of disposition of the fixed blind of the field of view illumination aperture 11 is conjugate to the pattern surface of the reticle R, and the shape of illumination region 15 is regulated by the opening of the fixed blind.

In the following explanation, the directions in FIG. 1 are defined as follows: in a plane parallel to the reticle R, x-axis is perpendicular to the paper and y-axis is parallel to the paper, and z-axis is perpendicular to the plane of the reticle R. The illumination region 15 on the reticle R is a rectangular shaped region elongated in x-direction, and during the scanning exposure, the reticle R is scanned in +y direction or -y direction in the illumination region 15. In other words, scanning direction is horizontal in FIG. 1.

The pattern within the illumination region 15 on the reticle R is projected on a rectangular exposure region 16 on the wafer W through a projection system PL which is tele-centric on both sides (or on wafer side only) of the optical system at a projection magnification β (for example, ¼ or ⅕) so that the projected image is reduced in size on the wafer coated with a photoresist material.

Reticle R is supported on the reticle stage 17 which is disposed on a guide member extending in y-direction through air bearing on the reticle support base 18. Reticle stage 17 can translate at a constant speed on the reticle support base 18 in y-direction by means of a linear motor, and has an orientation adjusting device to adjust the position of reticle R in x- and y-directions as well as in rotational direction (θ direction). A mirror 19*m* fixed to an end of the reticle stage 17 and a laser interferometer 19 fixed to a column (not shown) are used to determine the position of the reticle stage 17 (reticle R) in the x- and y-directions at a resolution precision of about 0.001 μm. Linear translation measurements as well as rotational measurements of the reticle stage 17 are supplied to the stage control device 13, which controls the action of the linear motor and others on the reticle support base 18.

The wafer W is disposed in a wafer holder 20 of a sample pedestal 21 which is placed on a wafer stage 22 which is disposed on the guides of a fixed base 23 through air bearing. Wafer stage 22 is arranged on the fixed base 23 so that it can be moved by linear motor at a given speed, continuously or in steps in y-direction, and in steps in x-direction. Inside the wafer stage 22 are assembled a z-stage mechanism to move the sample pedestal 21 within a certain range in z-direction, and a tilt mechanism to adjust the tilt angle (leveling device) of the sample pedestal 21.

A mirror 24*m* fixed to an end of the sample pedestal 21 and a laser interferometer 24 fixed to a column (not shown) are used to determine the position of sample pedestal 21 (wafer W) in the x- and y-directions at a resolution precision of about 0.001 μm. Linear translation measurements as well as rotational measurements of the sample pedestal 21 are supplied to the stage control device 13, which controls the action of the linear motor and others on the wafer stage 22.

To start the process of scanning exposure, main controller 7 issues a begin-exposure command to the stage control device 13, and responding to this command, the stage control device 13 operates the reticle R on the reticle stage 17 in y-direction at a speed $V_R$ and synchronously, wafer W on the wafer stage 22 is moved in y-direction at a speed $V_W$. The scanning speeds $V_W$ is computed as $\beta V_R$ on the basis of the projection magnification β from reticle R to wafer W.

The projection system PL is contained in the upper plate of a channel shaped support column 25 disposed on the fixed base 23. Focusing is performed automatically by projecting slit images and the like on a plurality of focus points at an angle to the wafer W from a slant-type auto-focus sensor (AF sensor hereinbelow) 26 disposed on an x-direction lateral surface of the projection system PL, which outputs auto-focusing signals to correspond to the z-positions (focus points) of the plurality of focus points. Focusing signals generated from the multi-point auto-focus sensor 26 are supplied to an auto-focus/tilt control device 27, which computes the focus position and tilt angle of the wafer surface W, and the computed results are supplied to the stage control device 13.

Stage control device 13 adjusts the z-stage and tilt mechanisms in the wafer stage 22 by servo-control so that the supplied data of auto-focus position and tilt angle match with the target focus position and tilt angle of the focus plane of the projection system PL. Therefore, even during the scanning exposure process, the surface within the exposure region 16 on the wafer W is controlled to constantly match the focus image formed in the projection system PL according to the auto-focus, auto-leveling arrangements.

Further, an off-axis type wafer alignment sensor 28 is fixed on a +y lateral surface of the projection system PL to align the wafer W. For alignment, the wafer alignment sensor 28 detects the position of a wafer alignment mark provided on each shot region of the wafer W, and the detection signal is supplied to the wafer alignment device 29. Wafer alignment device 29 also receives measured signals from laser interferometer 24, and the wafer alignment device 29 computes the stage coordinates (x, y) of a target wafer mark from the received signals and supplies the results to the main control device 7. Here, stage coordinates (x, y) refer to a coordinate system based on the measurements of x- and y-coordinates of the sample pedestal 21 obtained by the laser interferometer 24. Main control device 7 obtains the arrayed coordinates of the stage coordinates (x, y) of each shot region on the wafer W, and supplies the data to the stage controller 13, which controls the position of wafer stage 22 for scanning exposure in each shot region, on the basis of the supplied data of the arrayed coordinates.

A referencing member FM is fixed on the sample pedestal 21, which provides many reference marks for referencing the position of the alignment sensor, a reference reflection surface to serve as a reflectivity reference for wafer W, and an opening to monitor radiation energy of the illumination beam IL on the wafer W through the projection system PL. Details will be described later. Above the reticle R, there is a reticle alignment system 30 for detecting luminous dose reflected from the region of the reference mark FM through the projection system PL. Detection signals from the reticle alignment system 30 are supplied to a reticle alignment device 31.

Next, the structure of the projection system PL shown in FIG. 1 will be explained with reference to FIG. 2.

Figure 2:
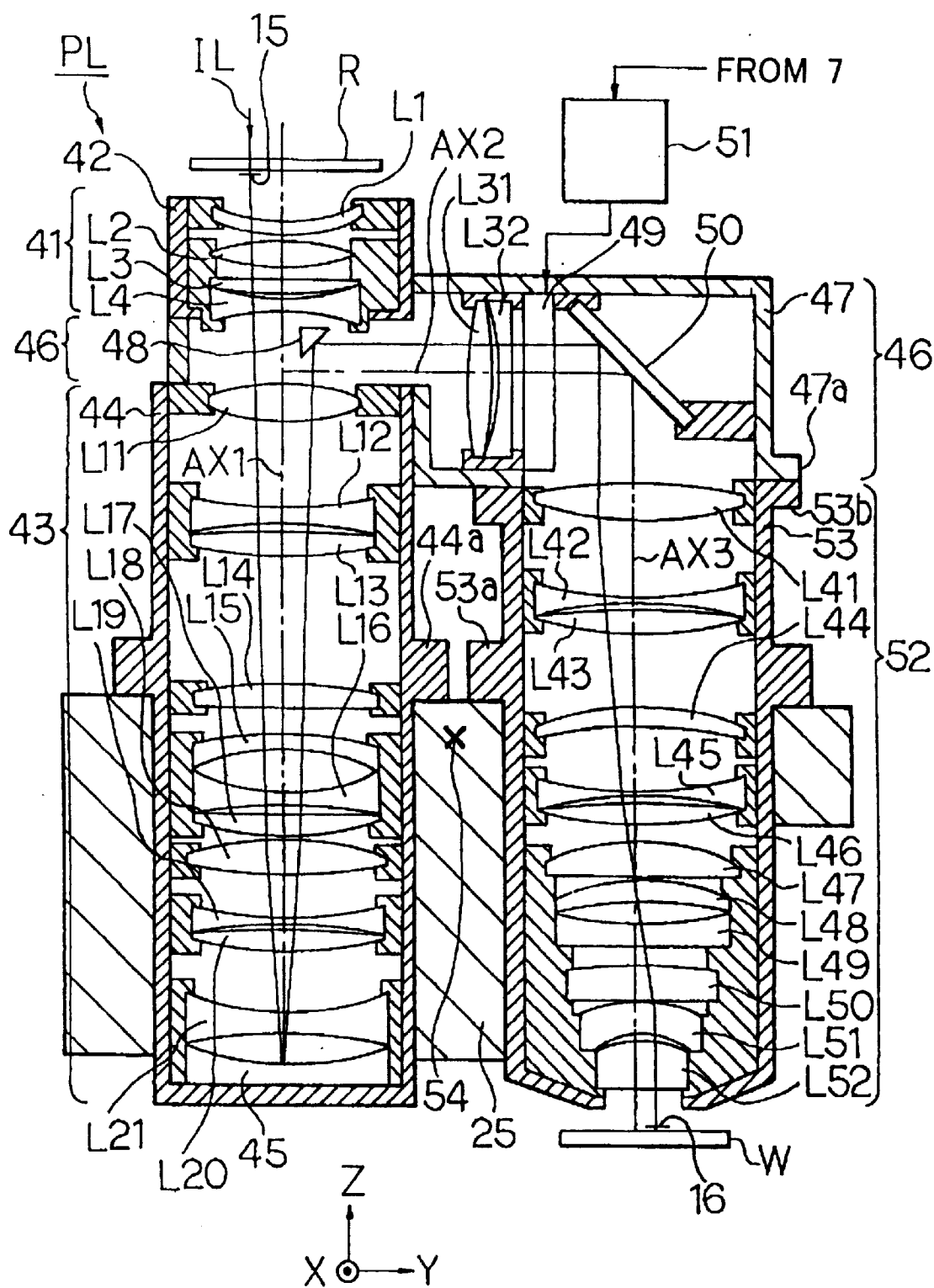
FIG. 2 is a cross sectional view of the projection optical system of the apparatus shown in FIG. 1.

FIG. 2 is a cross sectional view of the projection system PL, which is comprised mechanically by four sections: a first objective section 41, an foldback section 43, a deflection section 46, and a second objective section 52. The foldback section 43 has a concave mirror 45.

The use of wideband laser light as illumination light IL presents advantages that, optical power is higher for a given input of electrical power, thereby improving the productivity and reducing adverse interference effects caused by degraded coherence. However, when ultraviolet light, radiated from a light source such as ArF excimer laser, is used for illumination as in this embodiment, optical elements which can be used for diffraction lenses in the projection system PL are limited to quartz and fluorite. It is difficult to design the projection system PL using only diffraction type elements. For this reason, diffractive elements and reflective elements such as concave mirror which does not generate chromatic aberration are used in designing the projection system PL, in this embodiment, to carry out wideband chromatic correction. However, reflective systems are generally used for a 1:1 imaging, therefore, it is necessary to devise special designs when the projected image needs to be reduced to ¼ or ⅕, as required in the present projection system design.

That is, immediately below the reticle R is the first objective section 41 with successive lenses L1, L2, L3, L4 away from the reticle R mounted in lens frame fixed to the lens barrel 42. Past the lens barrel 42 is the deflection section 46 inside a lens barrel 47, followed by the foldback section 43 inside the lens barrel 44 which contains successive lenses L11, L12, . . . L20, L21 mounted in lens frames, away from the reticle R and ending in the concave reflection mirror 45. The first objective section 41 and the foldback section 43 are coaxial and whose optical axis is referred to as optical axis AX1. Optical axis AX1 is at right angles to the pattern surface on the reticle R.

In the deflection section 46, inside the lens barrel 47 and between the lens barrels 42 and 44, a miniature reflection mirror 48 is disposed off-axis from AX1 and towards +y-direction, with its reflection surface inclined at 45 degrees to the optical axis AX1 to reflect in +y-direction. Inside the lens barrel 47 and away from the miniature mirror 48 in +y-direction, there are successive lenses L31, L32, a corrective optical system 49 and a beam splitter 50. Optical axis AX2 of the deflection section 46 is at right angles to optical axis AX1, and the reflection surface of the beam splitter 50 is inclined at about 45 degrees to the optical AX2 so as to be perpendicular to the reflection surface of the miniature mirror 48. Beam splitter 50 is a highly reflective element and has about 5% transmission coefficient and 95% reflection coefficient. The role of the luminuous dose passing through the beam splitter 50 will be explained later. Corrective optical system 49 is comprised by a micro-adjustable lens group to enable translation in the direction of optical axis AX2 as well as to orient with respect to a plane orthogonal to optical axis AX2. Position and orientation of the corrective optical system 49 are controlled by a focusing correction device 51 which in turn is controlled by the main control device 7. The location of the corrective optical system 49 is approximately conjugate to the pattern surface on the reticle R, and its main function is to correct distortions such as magnification error.

The second objective section 52 is contained in a lens barrel 53, which is aligned in the direction of the optical axis AX2 bent at the beam splitter 50, and is comprised by successive lenses L41, L42, L43, . . . , mounted in lens frames, away from the beam splitter 50, and ending in L52 whose bottom surface opposes the front face of the wafer W. The optical axis AX3 of the second objective section 52 is parallel to the optical axis AX1 of the first objective section 41 and the foldback section 43, and is perpendicular to the optical axis AX2 of deflection section 46.

Optics of the illumination light will be explained next. Illumination beam IL, referred to as "focusing dose" in this case, passes through the rectangular illumination region 15 on the reticle R (which is displaced away from the optical axis AX1 towards −y-direction) and passes through lenses L1, L2, . . . , L4 and through the interior of lens barrel 47 of the deflection section 46 enters the foldback section 43. Focusing dose input into the foldback section 43 passes through lenses L11, L12, . . . , L20, L21 and enters the concave mirror 45, where it is reflectively condensed, and again passes lenses L21, L20, . . . , L12, L11 and is deflected in +y-direction by the miniature mirror 48 of the deflection section 46 in the lens barrel 47.

Focusing dose reflected by the miniature mirror 48 passes through lenses L31, L32 and the corrective optical system 49 and radiates on the beam splitter 50. At this point, an image of about the same size as the pattern in the illumination region 15 on the reticle R is formed and is referred to as an intermediate image. For this reason, the composite optical system comprised by the first objective section 41 and the foldback section 43 is referred to as "equi-image optical system". Focusing dose deflected by the beam splitter 50 in −z-direction propagates to the second objective section 52 and passes through lenses L41, L42, . . . , L51, L52 and forms a reduced-size image of the pattern of the illumination region 15 on the exposure region 16 on the wafer W. Thus, the second objective section 52 is also referred as "reduced-image optical system".

As described above, focusing dose passing through the illumination region 15 on the reticle R in close to −z-direction is turned back in close to +z-direction by the first objective section 41 and foldback section 43. Focusing dose is further deflected in close to +y-direction and close to −z-direction successively by the deflection section 46, and during this propagation period, forms an intermediate image of about the same size as the pattern in the illumination region 15, and passes through the second objective section 52 to form an image of a reduced size on the exposure region 16. By adopting such an assembly of the projection system PL, the lens groups L2~L4, L11~L21, L31, L32, L41~L52 can all be made axially symmetrical, and almost all the lenses can be made of quartz so that only about 3~4 lenses need to be made of fluorite, thus enabling to use a wideband illumination light IL so that precision chromatic corrections can be provided within a wideband region of approximately 100 pm.

The present projection system PL is optically divided into an equi-image optics section comprised by the first objective section 41 and the foldback section 43, the deflection section 46, and the reduced-image optics section comprised by the second objective section 52. Mechanically, however, the miniature mirror 48 is interposed between a lens L4 in the first objective section 41 and a lens L11 in the foldback section 43. For this reason, if lens L4, miniature mirror 48 and lens L11 are assembled in a single lens barrel, it is necessary to assemble the mirror 48 in the deflection section 46 and the beam splitter 50 in different lens barrels for reasons of adjustability. However, if the mirror 48 and the beam splitter 50 are assembled into separate lens barrels, perpendicularity of the reflecting surfaces of the two parts may be altered. If the perpendicularity of the two reflecting surfaces is disturbed, focusing capability is seriously degraded. For this reason, the equi-image optics section in this embodiment is separated into first objective section 41 and foldback section 43 which are connected by way of the lens barrel 47 of the deflection section 46, so that the mirror 48 and the beam splitter 50 may be fixed in the lens barrel 47.

Prior to assembling the projection system PL, first objective section 41, foldback section 43, deflection section 46 and second objective section 52 are pre-assembled separately and adjusted. Then, bottom sections of the lens barrel 44 for the deflection section 43 and the lens barrel 53 for the second objective 52 are inserted into holes of the upper plate of the support column 25, and metal washers are placed between upper plate of the support column 25 and the flange 44a of the lens barrel 44 and the flange 53a of the lens barrel 53, and flanges 44a and 53a are temporarily fastened to the upper plate. Next, the lens barrel 47 is placed above the lens barrels 44 and 53, and washers are placed between the flanges 47a of the lens barrel 47 and the upper flange 53b of the lens barrel 53, then flange 47a is temporarily fastened to flange 53a.

Next, a laser beam for system adjustment is radiated from above lens L11 in the lens barrel 44 to monitor the location of the beam exiting from the bottom-most lens L52 in the lens barrel 53 (corresponding to the front face of the wafer W), and the thickness of the washers on the flange 44a, 53a, 47a and lateral positions of the lens barrels 42, 53 and 47 are adjusted so that the monitored location matches the target location. When the position of the adjusting laser beam coincides with the target position, flanges 44a, 53a and 47a are firmly fastened, thereby fixing the positions of the foldback section 43, second objective 52 and the deflection section 46. Finally, lens barrel 42 of the first objective section 41 is moved to the top end of the lens barrel 47 in −y-direction, and a washer is placed between the flange (not shown) of lens barrel 47 and the corresponding flange of lens barrel 47 to place lens barrel 47 on lens barrel 42. Then, a laser beam is again radiated from above lens L1 of lens barrel 42 to align the optical axes, and then lens barrel 47 is fastened to lens barrel 42, thereby completing assembly of projection system PL into the projection apparatus.

Furthermore, attention is paid to stability of the focusing system against vibrations and mechanical balance of the projection system PL, so that the overall center of gravity 54 (marked by x in FIG. 2) of the projection system PL is placed outside of the optical paths of the focusing dose. As shown in FIG. 2, the center of gravity 54 is in the middle of foldback section 43 and second objective section 52, and is slightly below the flange 44a of lens barrel 44 and flange 53a of lens barrel 53 (interior of the upper plate of support column 25). Accordingly, by placing the center of gravity 54 close to the flanges 44a, 53a, the projection system PL is given higher vibration resistance and rigidity.

Also, as described above, the system is designed so that the intermediate image which is conjugate to the pattern surface on the reticle R is formed inside the deflection section 46 and near the beam splitter 50, and the corrective optical system 49 is placed near the intermediate image. By micro-adjusting the lens group (corrective optical system 49, for example) in the AX2-direction or the orientation of the lens group with respect to the vertical plane to the optical AX2, optical properties such as projection magnification and distortion of the reduced image of the pattern on the reticle R on the wafer W may be corrected. In contrast, in the conventional apparatus such a corrective device is provided directly below the reticle R. The advantage of the present design is that, because there is no corrective device below the reticle R and no mechanical restriction, high rigidity can be designed for the reticle support base 18. Also, if a micro-adjuster similar to the corrective optical system 49 is provided for the foldback section 43 or the second objective section 52, it is possible to provide for image aberration corrections (astigmatic aberration and coma aberration) or spherical aberration of the image. Or, such corrective measures could be combined to correct higher order error in projection magnifications.

Next, positional relation of the illumination region 15 on the reticle R to the exposure region 16 on the wafer W will be explained with reference to FIGS. 3A~3D.

Figure 3A:
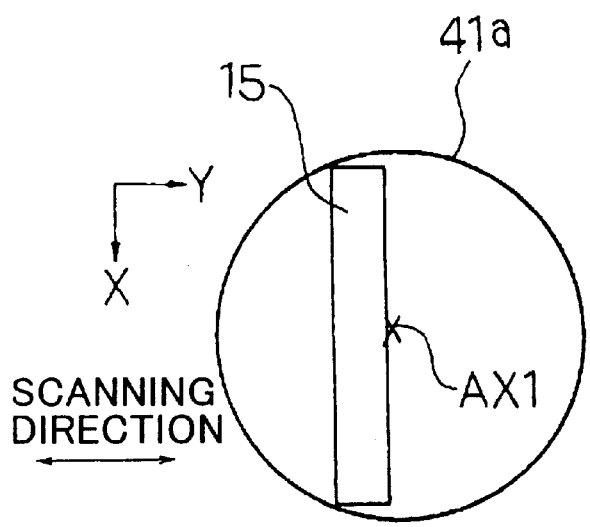
FIGS. 3A–3D are illustrations of the relation of illuminated area to the exposed area in the PL system shown in FIG. 2, and variations in the exposed area.

FIG. 3A, shows the illumination region 15 on the reticle R, the illumination region 15, of a rectangular shape extending in x-direction, is projected within an effective field-of-view (FOV) illumination area 41a of the first objective section 41 but is offset slightly towards −y-direction with respect to the optical axis AX1. The short perimeter (y-direction) is the scanning direction for the reticle R. This is because, referring to FIG. 2, in the equi-image optical system (comprised by first objective section 41 and foldback section 43), because the focusing dose passing through the illumination region 15 is reflected back by the concave mirror 45 to radiate on the miniature mirror 48, it is necessary to offset the illumination region 15 with respect to AX1.

Figure 3B:
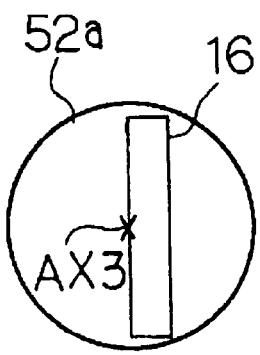

On the other hand, FIG. 3B shows a rectangular exposure region 16 with the long perimeter extending in x-direction (conjugate to illumination region 15) on the wafer W which is offset slightly towards +y-direction with respect to AX3 within an effective FOV exposure area 52a of the second objective section (reduced-image optical system).

Figure 3C:
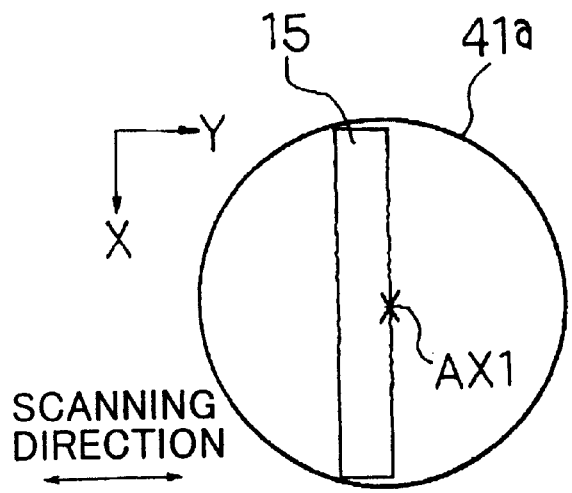
Figure 3D:
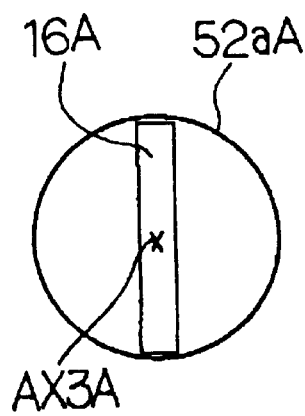

On the other hand, FIG. 3C shows the illumination region 15 which is slightly offset towards −y-direction with respect to AX1, which is the same as FIG. 3A. FIG. 3D shows an effective FOV exposure area 52aA generated by a modification of the second objective section 52 shown in FIG. 2. A rectangular exposure region 16 with the long perimeter extending in x-direction (a conjugate area to illumination region 15 shown in FIG. 3C) is centered about AX3A, which is the optical axis of the effective exposure area 52aA. FIG. 3D is presented to show that, by altering the construction of the second objective section 52 (reduced-image optical system) which is the last stage in the projection system PL, the exposure region 16A can be centered on the optical axis in the effective FOV exposure area 52aA. Choice between the two imaging shown in FIGS. 3B, 3D is made on the basis of ease of designing aberration corrections in the projection system PL, but the imaging method shown in FIG. 3B can be designed easily while the imaging method shown in FIG. 3D is advantageous because the lens diameters in the reduced-image optical system can be reduced slightly.

Next, the construction of the off-axis type wafer alignment sensor 28 shown in FIG. 1 will be explained with reference to FIG. 4.

Figure 4:
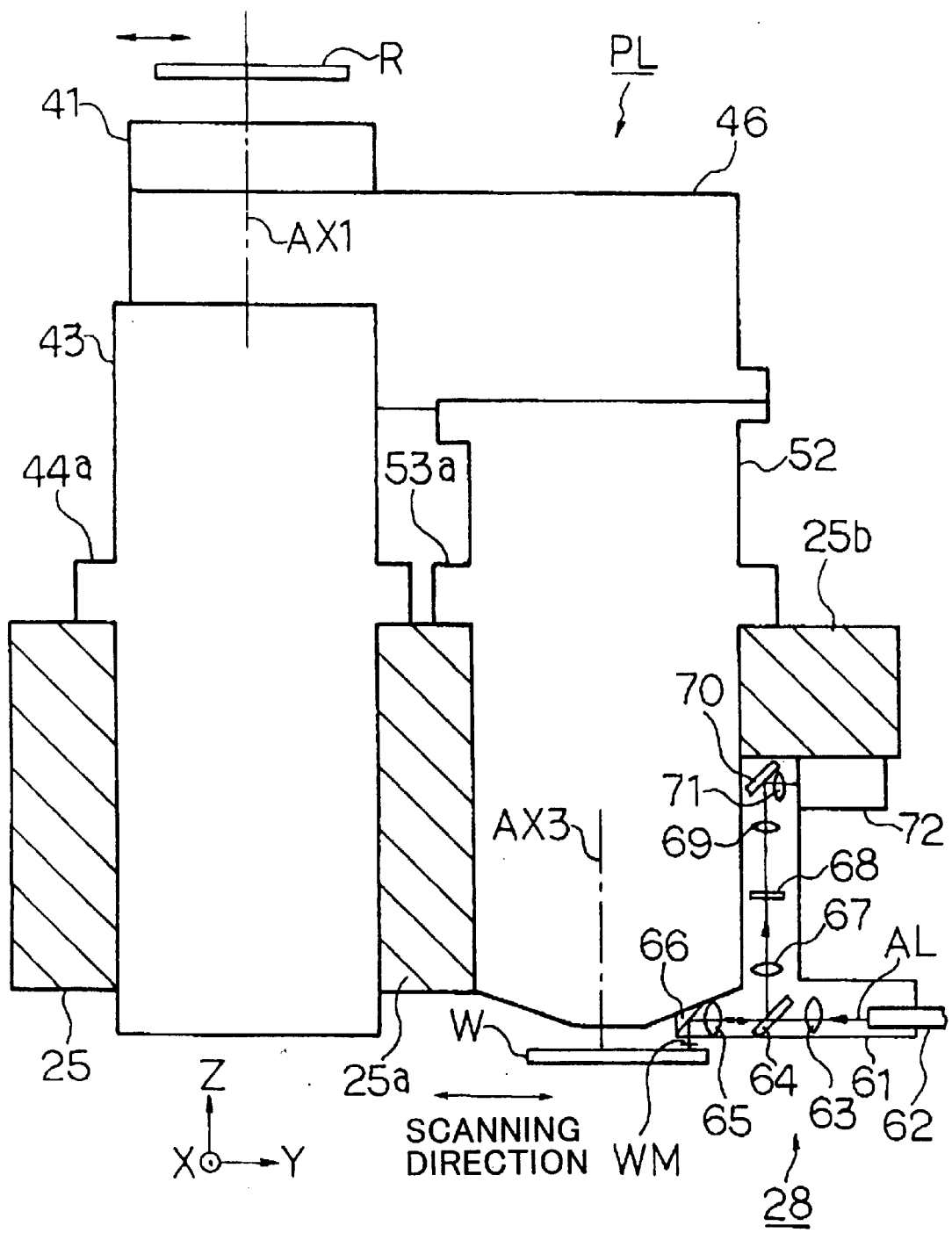
FIG. 4 is a partial cross sectional view of a wafer alignment sensor of an off-axis type used in FIG. 1.

FIG. 4 is an external outline of the projection system PL shown in FIG. 2. As shown in FIG. 4, the projection system PL is separated into first objective section 41, deflection section 46, foldback section 43, and second objective section 52, and it is necessary to design the system so that the components are not susceptible to external disturbance caused by such factors as vibration and heat. Therefore, high rigidity is required on the support column 25 where the flanges 44a, 53a are disposed, and in particular, for the partition section 25a between the foldback section 43 and second objective section 52 within the support column 25. The wafer alignment sensor 28 is used to detect the position of wafer mark WM for the alignment of the wafer W, therefore, to produce such a rigidity in the system, the wafer alignment sensor 28 must be located on a lateral surface of second objective section 52 and opposite to the partition section 25a which requires high rigidity. This means that the wafer alignment sensor 28 must be located on a lateral surface in +y-direction of the second objective section 52. Within the support column 25, the lateral surface of the second objective section 52 in +y-direction and the partition section 25b opposite to the lateral surface in +x- and −x-directions are only ½ the thickness of the partition section 25a, and the wafer alignment sensor 28 is located on the bottom surface of such a relatively thin section. By adopting such an arrangement, it is possible to maintain high integrity of the projection system PL even when the reticle R and the wafer are being scanned in the arrow direction during scanning exposure in y-direction, by supporting the first objective section 41, deflection section 46, foldback section 43 and second objective section 52 as a rigid one unit, to produce high rigidity in the projection system PL.

The off-axis wafer alignment sensor 28 uses a wideband light (white light) generated by a halogen lamp which produces light which is non-reactive to the photoresist material. An alignment beam AL passes through an optical guide 62 to enter a guide lens barrel 61 of the wafer alignment sensor 28, and passes through a condenser lens 63 and transmits through a half-mirror 64 to reach a first objective lens 65 and a prismatic deflection mirror 66, and illuminates a certain area including the wafer mark WM on the wafer W. Reflected light from the wafer W passes through the first objective lens 65 and reflected by the half-mirror 64, and the second objective lens 67 forms an image of the wafer mark WM on an indicator plate 68. The indicator plate 68 has an index mark to serve as a reference to the position of the wafer mark WM.

Focusing dose passes through the index plate 68, a first relay lens 69, a deflection mirror 70 and forms images of the wafer mark WM and the reference mark on an imaging device 72 comprised by a (two-dimensional) CCD element. The wafer marks WM may be lattice type marks having protrusions and depressions which are disposed at a given spacing on y-axis in y-direction. Image signals from the imaging device 72 are supplied to the wafer alignment device 29 shown in FIG. 1. Wafer alignment device 29 computes displacement of the wafer marks WM in y-direction with respect to the reference mark on the index plate 68. The measured displacement values are added to the y-coordinate determined by the laser interferometer 24 to obtain stage coordinates (x, y) of the wafer mark WM, and the results are supplied to the main control device 7. Wafer marks on the x-axis which are rotated 90 degrees to y-axis are also included in the shot area, and the stage coordinates (x, y) on the x-axis are also measured by the wafer alignment sensor 28. The wafer alignment sensor 28 thus aligns all the wafer marks WM provided in a given shot area on the wafer W, thereby aligning the wafer W.

To produce high precision alignment, it is necessary to minimize the distance (baseline value) between the center of the wafer alignment sensor 28 (center of a projected image of the index mark on the wafer) and the center of the projected image of the pattern on the reticle R in the projection system PL (center of the exposure region 16). For this reason, wafer alignment sensor 28 is disposed as close to the second objective section 52 in the projection system PL as possible. The baseline value can be determined using the referencing member FM shown in FIG. 1.

However, there is another component of the apparatus which needs to be disposed close to the second objective section 52. This component is the multi-point AF sensor shown in FIG. 1 for detection of focusing position of the wafer W and tilt angle. To prevent mechanical interference between the wafer alignment sensor 28 and the AF sensor 26, the AF sensor 26 is disposed in the ±x-directions of the second objective section 52 so that the AF sensor 26 will be perpendicular to the wafer alignment sensor 28.

Figure 5:
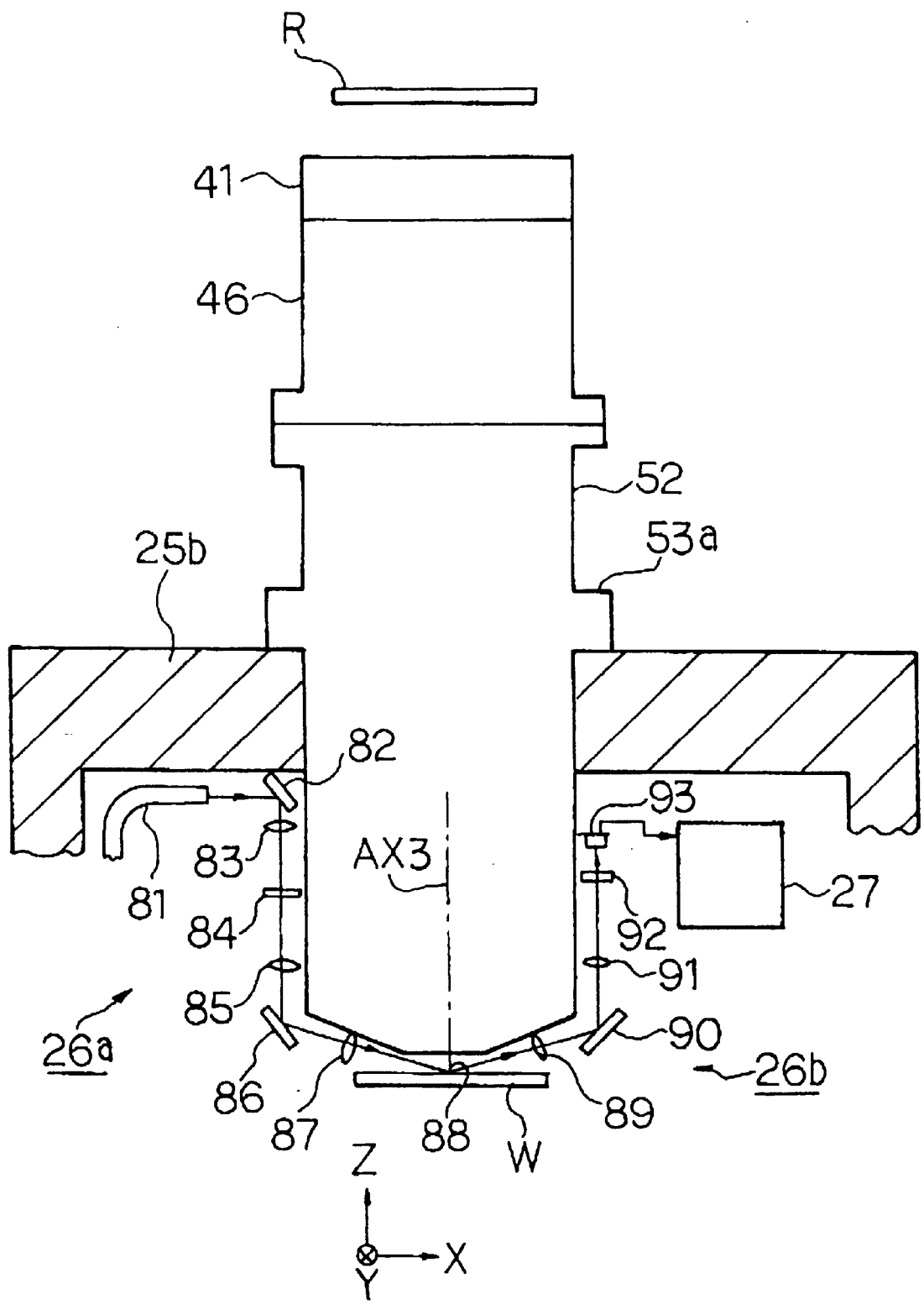
FIG. 5 is a partial cross sectional view of the AF sensor of multiple points in FIG. 1.

FIG. 5 shows details of the AF sensor 26 in a cross sectional view in a plane perpendicular to y-axis (an xz plane) through the optical axis AX3 of the second objective section 52 shown in FIG. 4, but for illustration purposes, the upper half in FIG. 5 is a left side view of the reticle R and the first objective section 41 seen in FIG. 4. AF sensor 26 is divided into illumination system 26a and condensing system 26b, both of which are located in the bottom section of the thin section 25b, relative to the thick and high rigidity section 25a, on the lateral surface of the second objective section 52 in ±x-directions.

AF sensor 26 operates as follows. First, in the illumination system 26a, white illumination light from a light source such as halogen lamp, which produces light which is non-reactive to the photoresist material, is guided to the lateral section of the second objective section 52 through an optical guide 81, and enters a mirror 82 and a condenser lens 82 and illuminates a multi-slit plate 84 having an array of slits. Illumination light passes through the slits, lens 85, vibration mirror 86, and lens 87 and projects conjugate images of the slits at an angle on the wafer W with respect to optical axis AX3 (in FIG. 5, 1 slit image 86 is shown for simplicity). These images are shown in the rectangular exposure region 16 on the wafer W seen in FIG. 1 and in the leading end of the scanning region of the exposure region 16, which is the foreground monitor region.

Reflected light from the slit images on the wafer W is input in the condensing system 26b, and passes through a lens 89, a mirror 90 and a lens 91 and re-focuses the slit images (including image 88) on a multi-slit plate 92 having slits to correspond with the multi-slit plate 84. On the back surface of the multi-slit plate 92, photodetector elements 93, such as photodiodes, for individual detection of light passing through each of the slits are formed on the multi-slit plate 92. Photo-conversion signals (referred to as focusing signals hereinbelow) from the photodetector elements 93 are supplied to the focus/tilt control device 27.

The re-focused slit images on the multi-slit plate 92 are subjected to vibration from the vibration mirror 86 in the direction of the short perimeter of the slits on the corresponding slits on the plate 92, and when the focusing position on the wafer W is changed by scanning, the centers of the vibrating slits and the stationary slits become laterally offset. By rectifying the focusing signals synchronized to the drive signals for the vibration mirror 86 in the focus/tilt control device 27, a signal level to correspond with the change in the focal distance for a projected slit image (88 for example) on the wafer can be obtained. This signal level is compared with the pre-calibrated synchronized signals in the AF sensor 26 for best focus which produces a 0-level. Therefore, focus/tilt control device 27 can obtain, from the synchronized rectified signals, averaged values of focusing position and tilt angle in the exposure region 16 as well as in the respective foreground monitor region. Such average values of the focusing positions and tilt angles are supplied almost in real-time to the stage control device 13, through the main control device 7, which performs auto-focusing and auto-leveling operations so as to match the exposure region 16 on the wafer W being scanned with the focusing plane of the projection system PL, as described above.

In FIG. 1, one laser interferometer 24 and one mirror 24m are shown but they are, in fact, disposed in a two-dimensional space on the wafer-side of the apparatus. Actual example of the arrangement of the laser interferometer and mirror will be presented with reference to FIGS. 6 and 7A, 7B.

Figure 6:
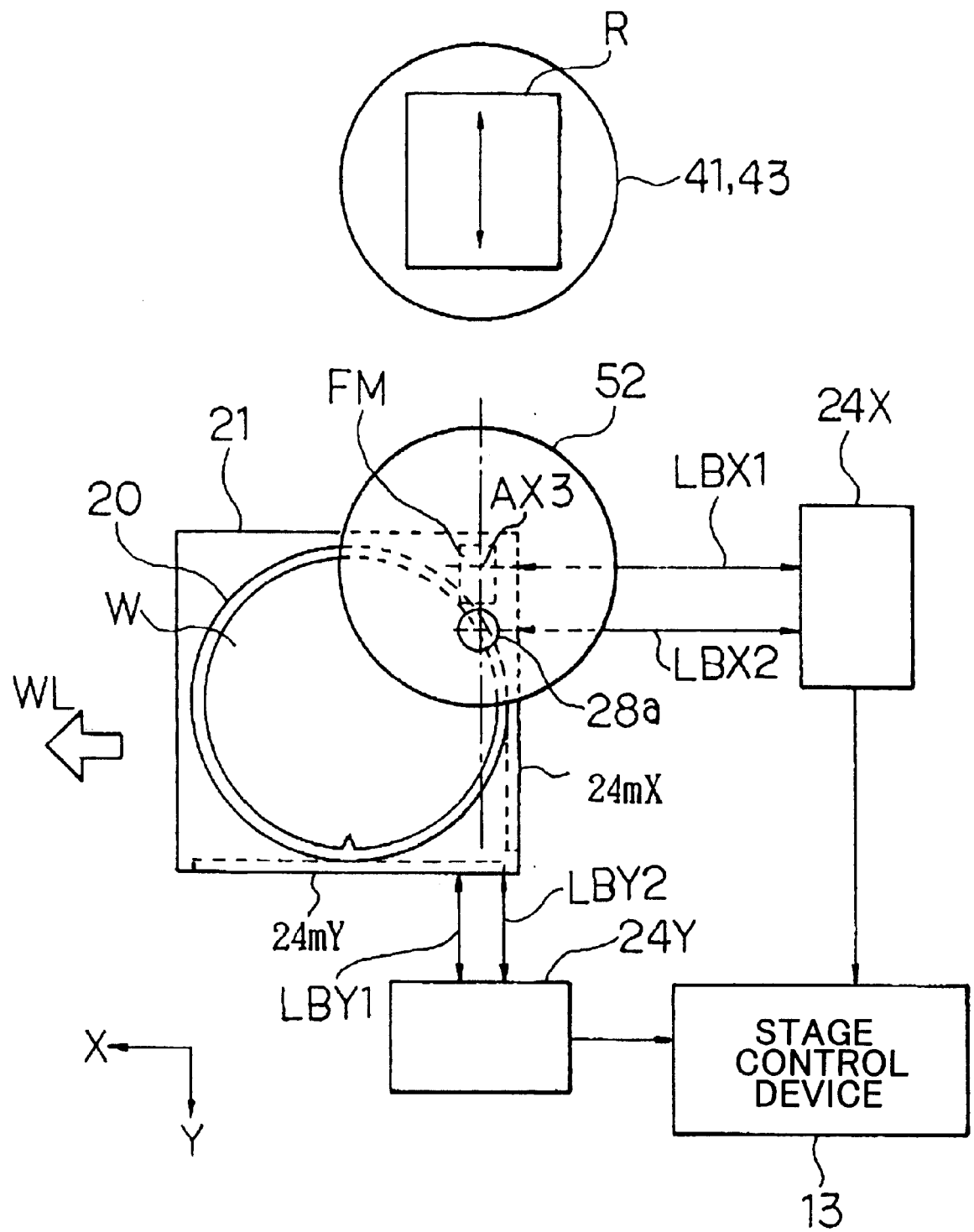
FIG. 6 is a plan view showing the relation of wafer-side laser interferometer and the projection system in FIG. 1.

FIG. 6 is a plan view of the sample pedestal 21 for the wafer W, and shows accurate positioning of the relevant components of the apparatus, but for convenience, only the component outlines are shown in FIG. 6. The components are the second objective section 52, the FOV of the wafer alignment sensor 28, the first objective section 41, foldback section 43 and the reticle R. FIG. 6 shows a case of the optical axis AX3 of the second objective section 52 being aligned with the referencing member FM provided on the sample pedestal 21.

As explained in FIG. 2, the support column 25 between the first objective section 41 with the foldback section 43 and the second objective section 52 is a strong structure to make it very rigid, therefore, it is difficult to place a laser interferometer between the two sections. Further, even if it had been possible to dispose an interferometer between the two sections, there is insufficient space to perform temperature adjustment of air in the space with air flowing down along the optical axis. Warm environment will subject the beam to convective flutter.

To avoid the adverse effects of air convection, laser interferometer is disposed as shown in FIG. 6 so as to be opposite to the second objective section 52 and the foldback section 43, in other words, +y-direction and −x-direction with respect to the second objective section 52. A mirror 24mY having a reflection surface at right angles to y-axis is fixed on a lateral surface of the sample pedestal 21 in +y-direction, and a mirror 24mX having a reflection surface at right angles to the x-axis is fixed on a lateral surface of the sample pedestal 21 in −x-direction. A laser interferometer 24Y disposed on y-axis to oppose the mirror 24mY on y-axis, radiates three axial beams on the mirror 24mY parallel to y-axis. In FIG. 6, two axial laser beams LBY1, LBY2 which are separated in x-direction at certain spacing are shown. The axial beams LBY1 and LBY2 pass through the optical axis AX3 of the second objective section 52 and the center of FOV 28a of the wafer alignment sensor 28 and are symmetrical with respect to a line parallel to y-axis.

Figure 7A:
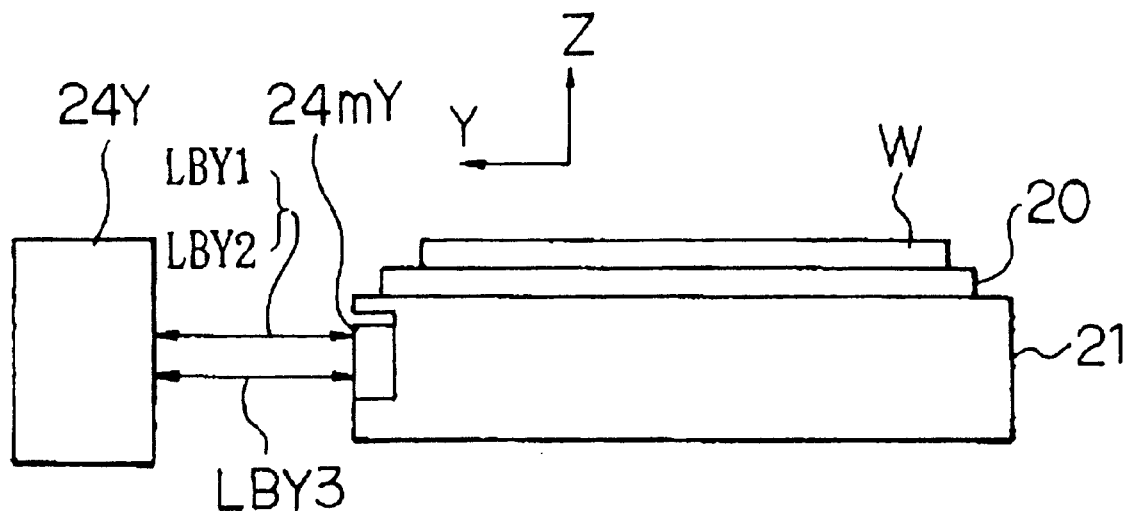
FIGS. 7A and 7B are, respectively, a side view and a perspective view of the sample stage 21 and the laser beam input in a mirror of the apparatus shown in FIG. 6.
Figure 7B:
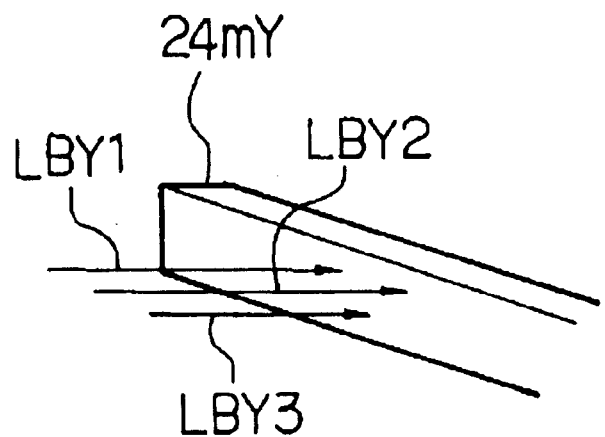

FIG. 7A is a side view of the sample pedestal 21 in +x-direction, and as can be seen in this drawing, a third laser beam LBY3 is separated from the two axial beams LBY1, LBY2 at a given distance in the z-direction, and radiates parallel to y-axis on the mirror 24mY. As illustrated in FIG. 7B, laser beam LBY3 is in the middle of beams LBY1 and LBY2 in x-direction. Laser interferometer 24Y constantly monitors y-axis coordinates, Y1, Y2 and Y3 to correspond with laser beams LBY1, LBY2 and LBY3 at a resolution of about 0.01 $\mu$m and outputs the results to the stage control device 13. Stage control device 13 computes an average value and difference portion of y-coordinates Y1, Y2, for example, and relates the results to y-coordinates of sample pedestal 21 and rotation angle (yawing). The rotation angle is corrected for the curvature of the mirror 24mY.

In FIG. 6, a laser interferometer 24X is disposed on the x-axis to oppose the mirror 24mX on the x-axis, radiates three axial beams on the mirror 24mY parallel to x-axis. In FIG. 6, two axial laser beams LBX1, LBX2 which are separated in y-direction at certain spacing are shown. The axial beams LBX1 and LBX2 pass, respectively, through a path that is parallel to x-axis and passes through the optical axis AX3 of the second objective section 52, and a path that is parallel to the x-axis and passes through the center of FOV 28a of the wafer alignment sensor 28.

Similar to FIGS. 7A and 7B, a third laser beam LBX3 is separated from the two laser beams LBX1, LBX2 at a given spacing in the z-direction, and is radiated from the laser interferometer 24X to a mirror 24mX parallel to the x-axis. Laser interferometer 24X constantly monitors x-axis coordinates, X1, X2 and X3 to correspond with laser beams LBX1, LBX2 and LBX3 at a resolution of about 0.01 $\mu$m and outputs the results to the stage control device 13. When the wafer W is to be exposed, x-coordinate X1 corresponding to AX3 is taken as the x-coordinate of sample pedestal 21, when the wafer W is to be aligned, x-coordinate X2 corresponding to the center of FOV 28a is taken as the x-coordinate of sample pedestal 21. By doing so, for both exposure and alignment purposes, the so-called Abbe's error caused by deviation of target position and measured axial position is reduced almost to zero to produce high precision imaging. Similar to the case of mirror 24mY on y-axis, the result is corrected for the mirror curvature.

The result of such an arrangement of the laser interferometers 24 is that in +y-direction of the sample pedestal 21 laser interferometers 24Y and 24X are disposed, and in −y-direction of the sample pedestal 21, the projection system PL comprised by the foldback section 43, second objective section and the like is disposed, thereby leaving the +x-direction of sample pedestal 21 (symmetrically opposite direction of 24X) for other uses. Therefore, in this embodiment, this direction is used to accommodate a wafer transport device including wafer loading/unloading device WL for the sample pedestal 21.

This arrangement permits downflow air conditioning of the laser beam path from the laser interferometers 24X, 24Y. Specifically, a downflow air conditioning may be achieved by direction uniform flow of air at uniform temperature from above the laser beams LBY1, LBY2, LBX1, LBX2 towards the floor where the projection apparatus is installed, and sweeping the air off the floor. This arrangement reduces the adverse effects of convective flutter in the path of laser beams to improve the measurement precision of position and orientation of the sample pedestal 21.

In FIG. 7A, sample pedestal 21 is made of a ceramic material and the mirror 24mY (also 24mX) are made of the same ceramic material as the pedestal 21. Mirror 24mY is fixed to a lateral surface of the sample pedestal 21 with screws (not shown). However, wafer W is held on the sample pedestal 21 by way of a wafer holder 20, and therefore, the position of wafer W is shifted in the z-direction from the positions of the optical axes of the laser beams LBY1, LBY2. For this reason, if the sample pedestal 21 is affected by pitching, the so-called Abbe's error produces a shift ΔY between the y-coordinate measured by the laser interferometer 24Y and the actual y-coordinate of the sample pedestal 21 (more accurately wafer W). Therefore, in this embodiment, using a laser beam LBY3 which passes through a point which is distanced from the beams LBY1, LBY2 in the z-direction, an average of y-coordinate values (Y1+Y2)/2 measured by laser beams LBY1, LBY2, and a difference portion of y-coordinate measured by laser beam LBY3, slant angle Δθ of sample pedestal 21 about the x-axis are computed. Average value of y-coordinate measured by laser beams LBY1, LBY2 is corrected by the slant angle Δθ to correct Abbe's error caused by the difference in the heights of the wafer W and the laser beams LBY1, LBY2.

Similarly for the laser interferometer 24X on the x-axis, by measuring the third laser beam, Abbe's error mixed in the measurement results obtained by the laser beams LBX1, LBX2 is corrected.

Accordingly, by attaching the mirrors 24mX, 24mY on the lateral surface of the sample pedestal 21, the space above the mirrors 24mX, 24mY can be used for such uses as placing of the end of the wafer holder 20. The result is that the overall size of the sample pedestal 21 is made compact and light weight, scanning and positioning of wafer W operations can be accurately controlled.

Further, fabrication of complex shapes in ceramic material is time-consuming and manufacturing cost is expensive. But, in this case, although the material of construction is the same for mirrors 24mY, 24mX and sample pedestal 21 that require planar precision, they are made separately and assembled later, therefore, the shape of each component is simplified, and the overall production cost is lowered. Also, if temperature control is difficult, materials of low linear coefficient of expansion such as glass ceramics (for example, Zerodur made by Schott Co.) is useable, although rigidity is not as high.

Next, the construction of the reticle alignment system 30 for reticle R, alignment marks (reticle marks) and corresponding reference marks, and an example of alignment operation of the reticle R will be explained with reference to FIGS. 8 and 9.

Figure 8:
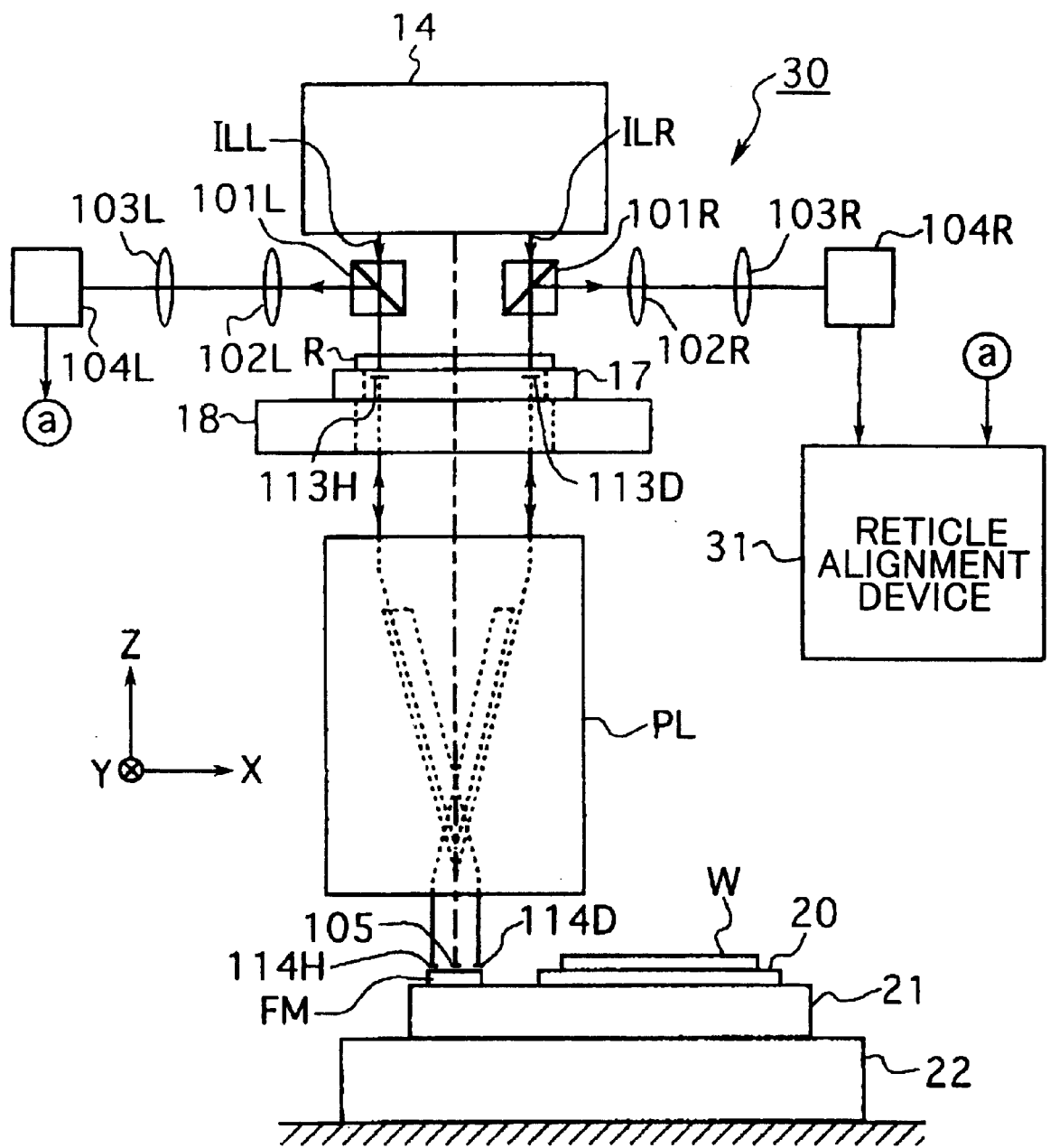
FIG. 8 is a side view of the reticle alignment system in FIG. 1 on the reticle side.

FIG. 8 is a side view of a third illumination system 14, components in a region form the reticle alignment system 30 to wafer stage 22 seen in y-direction. Four pairs of reticle marks are provided, in y-direction, on both sides of the pattern region on the pattern surface of the reticle R (two-dimensional crosses, for example). Four pairs of referencing member are provided on the surface of the referencing member FM on the sample pedestal 21 to correspond with reduced images of the four pairs of reticle marks. The surface of the referencing member FM is made to be at the same height as the surface of the wafer W. The reference marks in this case are, for example, reflective crosses of two-dimensional shape formed on a transparent optical plate.

Figure 9:
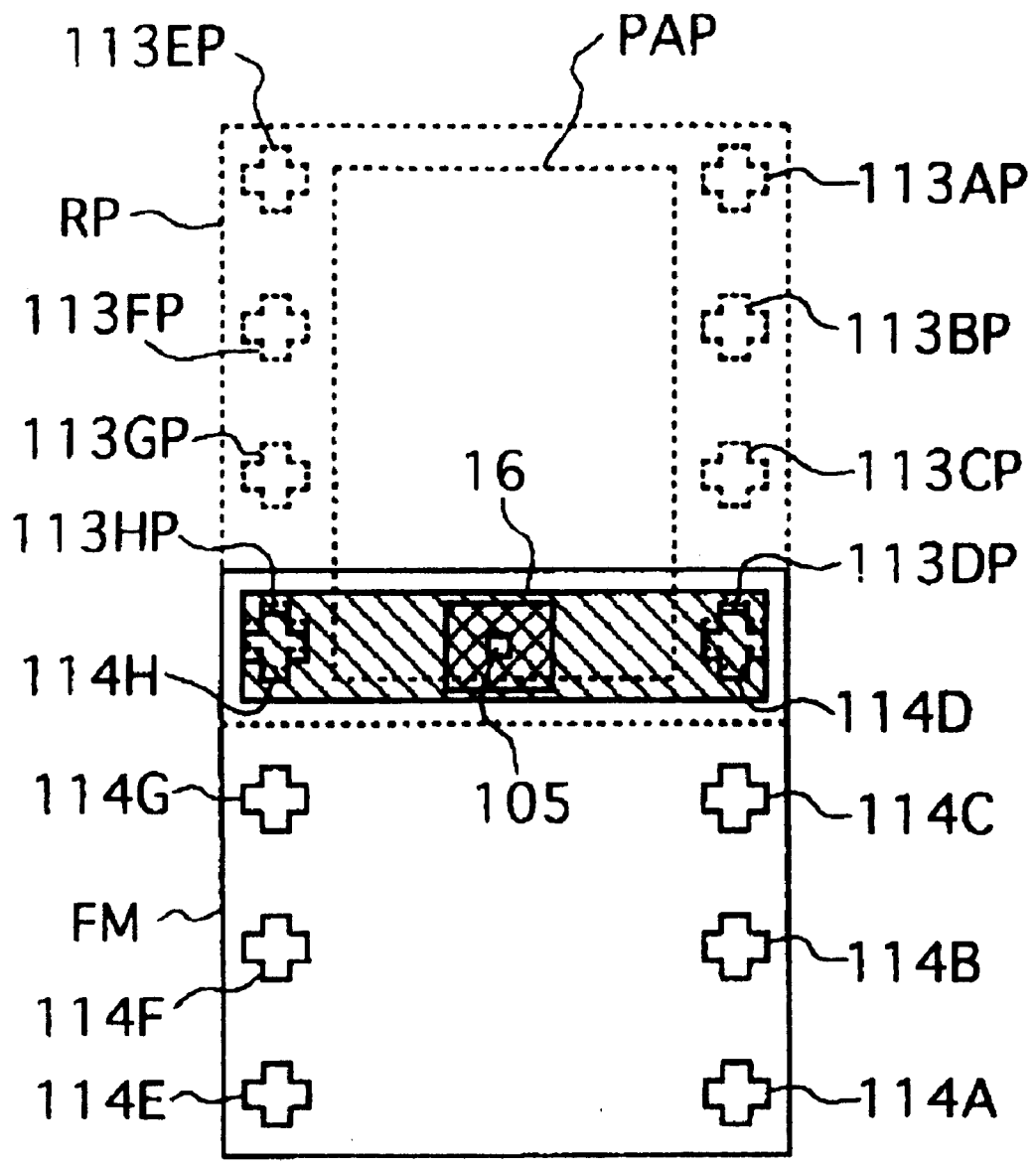
FIG. 9 is an enlarged plan view showing the relation of the projected images of a reticle marks and a reference mark.

FIG. 9 is an enlarged plan view of images of a portion of the projected image RP superimposed on the referencing member FM, showing a first, second, third and fourth pair of reference marks 114A and 114E; 114B and 114F; 114C and 114G; and 114D and 114H formed on the referencing member FM in y-direction. FIG. 9 also shows a pattern region image PAP in the center of a projected image RP of the reticle R. On both sides of the image PAP in y-direction, a first, second, third and fourth pair of reticle mark images 113AP and 113EP; 113BP and 113FP; 113CP and 113GP; and 113DP and 113HP are projected. FIG. 8 shows a pair of reference marks 114D, 114H and the reticle marks 113D and 113H to correspond with reticle mark images 113DP, 113HP in FIG. 9.

In this embodiment, to perform alignment of reticle R, reference marks 114D, 114H on the referencing member FM are first placed inside the rectangular exposure region 16 as shown in FIG. 9, and the reticle R is adjusted so that the reticle mark images 113DP, 113HP are roughly superimposed on the reference marks 114D, 114H. In this condition, a pair of half-prisms 101R, 101L are inserted in the paths of illumination light ILR, ILL radiated from the third illumination system 14 towards the reticle R, as shown in FIG. 8. During normal exposure step, half-prisms 101R, 101L are removed out of the light paths.

Illumination dose ILR emitted from the third illumination system 14 passes through half-prism 101R and is radiated on the reticle mark 113D on the reticle R, and the light reflected by the reticle mark 113D returns to half-prism 101R. Illumination dose ILR passing through the peripheral region of reticle mark R passes through the projection system PL and radiates on the reference mark 114D of the referencing member FM, and the light reflected by the reference mark 114D passes through the projection system PL and reticle R and returns to half-prism 101R. Reflected light from reticle mark 113D and reference mark 114D is reflected by half-prism 101R and passes through relay lenses 102R and 103R and forms images of the reticle mark 113D and reference mark 114D on an imaging surface of a two-dimensional imaging element 104R, such as CCD. Image signals from the imaging element 104R are supplied to reticle alignment device 31 which processes the signals and computes the values of positional deviation in the x- and y-directions of the reticle mark 113D with respect to the reference mark 114D.

Similarly, for the other illumination dose ILL and half-prism 101L, relay lenses 102L, 103L, and an imaging element 104L are provided, and the image signals from 104L are supplied to the reticle alignment device 31, which computes the values of positional deviation in the x- and y-directions of the reticle mark 113H with respect to the reference mark 114H. In this embodiment, the reticle alignment system 30 is comprised by half-prisms 101R, 101L, relay lenses 102R, 103R, relay lenses 102L, 103L and imaging elements 104R, 104L. Values of positional deviation of the projected images of the reticle marks 113D, 113H with respect to the reference marks 114D, 114H are supplied to the main control device 7.

Reticle alignment system in this case is provided with a fine-mode for determining the reticle position accurately after changing the reticle or when a shift is caused by such effects as heating, and a quick-mode for quickly checking the position of the reticle during or after wafer change. Quick-mode alignment is also referred to as interval alignment. In the fine-mode, after measuring the positional deviation between a pair of images of the reticle marks 113D, 113H in the condition shown in FIG. 8, the referencing member FM and the reticle R are moved in synchronization in y-direction to measure positional deviations in other three pairs of reference marks 114C, 114G~114A, 114E with respect to the reticle mark images 113CP, 113GP~113AP, 113EP. Based on the positional deviations of the four pairs of reticle marks, main control device 7 computes deviations of the positional deviations of the referencing member FM and thence the positional deviation of the projected image of the reticle R with respect to the wafer stage 22, rotation angle, distortion, and angular shift in the scanning direction, and controls the position of the reticle R by adjusting the stage control device 13 so as to minimize the positional deviations, corrects focusing of the projection system PL to minimize the distortion and corrects the scanning direction of the reticle R during the scanning exposure process.

In the quick-mode, as shown in FIG. 8, only the two-dimensional positional deviation values of the pair of images of the reticle marks 113D, 113H with respect to the reference marks 114D, 114H are measured, and the deviation of the reticle R and rotation angle, determined from the measured results, are corrected. By using this quick-mode, it is possible to correct alignment deviation of reticle R even during a short period of wafer exchange, and therefore, precision alignment of the projection apparatus can be maintained without sacrificing productivity. This alignment method is disclosed in detail in a Japanese Patent Application, First Publication, Hei 7-176468.

During alignment of the reticle R, the baseline of the wafer alignment sensor 28 on the wafer side of the system shown in FIG. 1 is also determined. Although not shown in FIG. 9, the referencing member FM is also provided with a wafer reference mark in a defined location with respect to the reference marks 114D, 114H, so that, when determining the reticle mark shifts using the reticle alignment system 30, positional deviation of the wafer reference mark is also measured using the wafer alignment sensor 28 to determine the baseline of the sensor 28.

Next, arrangement of the transmission coefficient measuring system in the projection system PL and an example of measuring process will be explained with reference to FIGS. 9~11. In this embodiment, during the aligning process of the reticle R in the quick-mode, transmission coefficient of illumination light IL through the projection system PL is determined concurrently. In this case, if the reticle R is loaded with a pattern, measured transmission coefficient of the projection system PL includes the transmission coefficient of that part of the illumination system past the reticle R and the integrator sensor 9. Also, because the quick-mode is a part of the fine-mode alignment, fine-mode alignment can naturally measure transmission coefficient in the projection system PL.

In this process, the quantity of illumination light (pulse energy) entering the projection system PL is determined by the integrator sensor 9 shown in FIG. 1. To determine the illumination power (intensity), a window section 105 having a pinhole pattern is provided on the shield film between the reference marks 114D, 114H on the referencing member FM, as shown in FIG. 9, which are used for quick-mode alignment. In the quick-mode process (interval alignment), reference marks 114D, 114H are moved into the exposure region 16 so that the window section 105 is also illuminated by the illumination light IL.

FIG. 10A shows the measurement system for determining the light intensity passing through the window section 105 on the referencing member FM. Illumination light passing through the window section 105 becomes a parallel light dose by passing through a lens 106 in the interior of the sample pedestal 21. Parallel light dose is reflected by a mirror 107, and passes through lenses 108, 109 to again become a parallel dose and enters one end of an optical fiber 110. The other end of the optical fiber 110 is disposed away from the main body of the projection exposure apparatus, and the light output from the other end is collected in an photoelectric detector 112 such as photomultiplier, which outputs photonic signals to the transmission coefficient computation section 1b in the exposure control device 1. Photoelectric detector 112 is placed remotely from the wafer stage so that the heat generated in the detector 112 would not affect the wafer stage.

Exposure control apparatus 1 has an exposure light control section 1a to control the quantity of exposure dose, and photonic signals from the integrator sensor 9 (shown in FIG. 1) are supplied to the exposure light control section 1a and transmission coefficient computation section 1b. The exposure light control section 1a is also supplied with information from the main control device 7, such as scanning speed of the wafer stage. In this embodiment, transmission coefficient computation section 1b has a set of conversion factors in its memory to obtain transmission coefficients from data obtained by dividing the detection signals from the photodetector 112 with photonic signals from the integrator sensor 9. Such conversion factors can be determined during assembly testing, for example, by using a light meter to determine the transmission coefficient of the projection system PL. If quick-mode alignment is being used, transmission coefficient computation section 1b multiplies the data (obtained by dividing the detection signals from the photodetector 112 with the detection signals from the integrator sensor 9) with the conversion factor to renew the old transmission coefficient in the projection system PL, and updated transmission coefficient is supplied to the exposure light computation section 1a.

The exposure light computation section 1b multiplies the computed transmission coefficient and a desired conversion factor (a factor for obtaining illuminance on the wafer W from the integrator sensor 9, when the transmission coefficient is 100%) with detection signals from the integrator sensor 9 to obtain the actual illuminance in the exposure region of the projection system PL, and adjusts output power of the excimer laser source 2 and the operation of the switcher device 6, shown in FIG. 1, to maintain the measured illuminance at the target value to suit the scanning speed, width of the exposure region 16 and sensitivity of the photoresist material and the like. By so doing, it is always possible to obtain a target value of exposure dose on the wafer W, even when the transmission coefficient of the projection system PL gradually changes due to the degrading effects of using light generated from ArF excimer laser.

Also, in this embodiment, ArF excimer laser passes through the measurement system comprised by lens 106 to photoelectric detector 112, therefore, when strong light dose is involved, problems such as evaporation of foreign substances and clouding of the optical systems by impurities may occur, thereby degrading the transmission quality of the projection system PL. To avoid such problems, illumination power is reduced by passing it through a pinhole window 105, but the beam is spread out to further reduce the power per unit area. Furthermore, the duration of transmission measurements in the projection system PL is made as short as possible, for example measurement of positional deviation using the quick-mode, so as to minimize the drift of transmission coefficient in the measurement system.

Figure 10B:
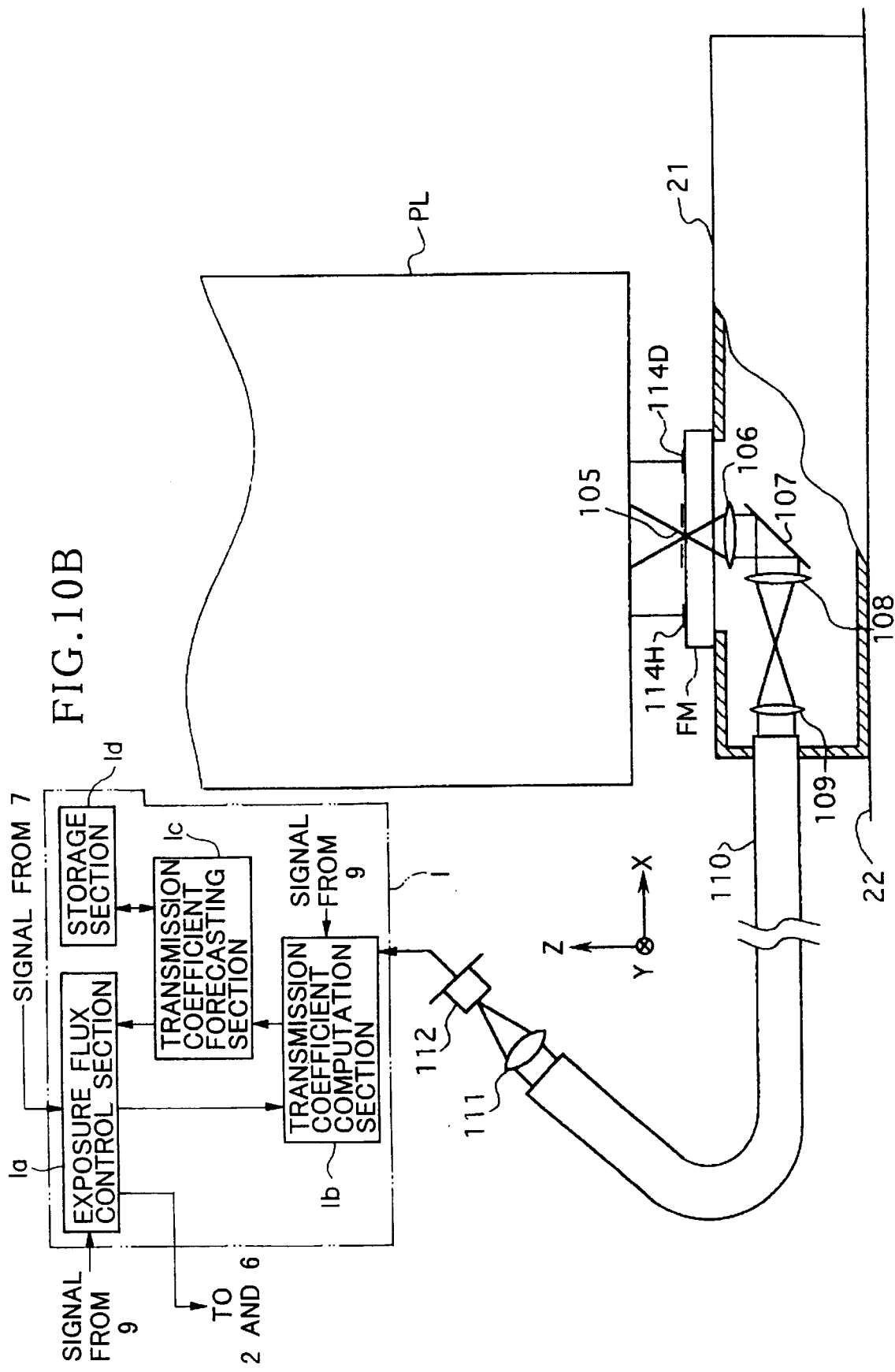

In a system shown in FIG. 1, if the size of the wafer W is small, while exchanging wafers, it is possible to align the reticle R as well as to measure the quantity of light transmitted through the projection system with the use of the quick-mode alignment, thereby allowing to track any degradation in the transmission coefficient. However, as the wafer size increases and the exposure duration increases, changes in transmission coefficient while exposing one such large wafer may not be ignored in some cases. In such a case, as shown in FIG. 10B, changes in transmission coefficient and illumination quantity for a given projection system (illumination history) may be pre-calibrated and stored in the memory (a storage section) 1d of the exposure control apparatus 1, so that the computed transmission coefficient to be multiplied with the photonic signals from the integrator sensor 9 can be corrected, in an open-loop configuration, by a transmission coefficient forecasting section 1c using its service history.

To obtain changes in the transmission coefficient of the projection system PL, illuminance of the illumination light itself may be assumed to remain constant during measurement, therefore, the transmission coefficient of the system PL may be expressed in a graph as a function of irradiation time t.

Figure 11B:
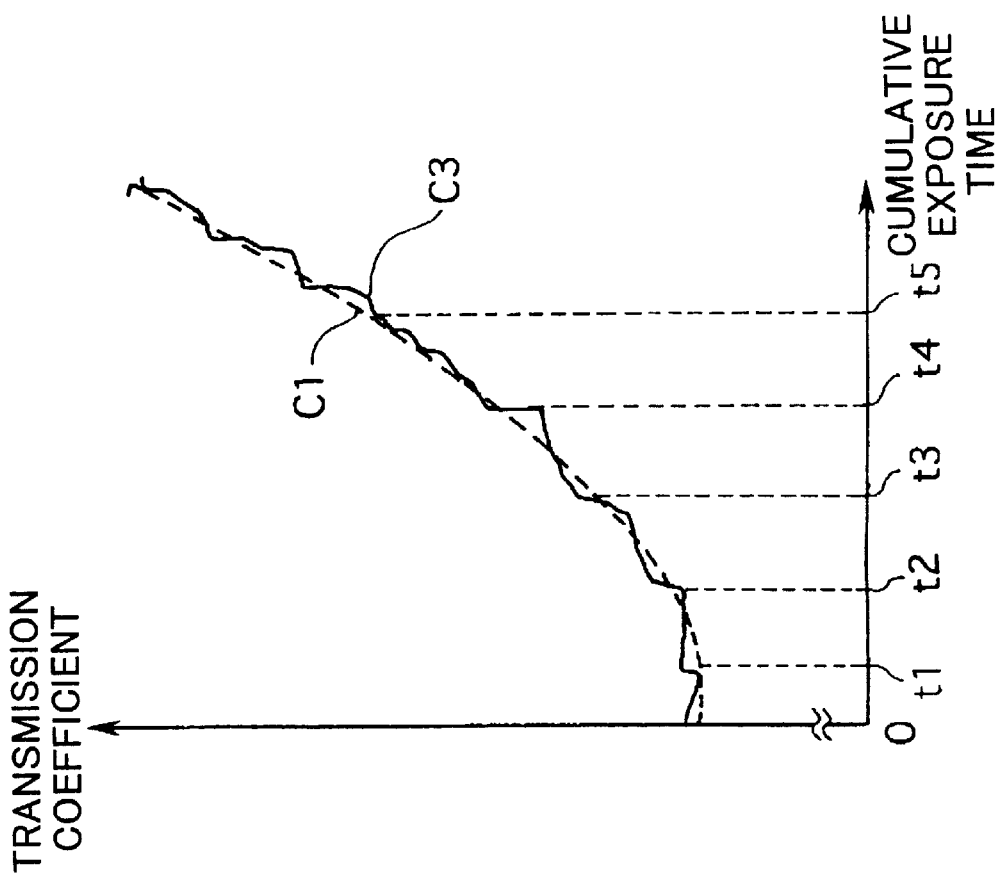
FIGS. 11A and 11B are, respectively, graphs showing the relation of irradiation duration to system transmission without and with regular checking of transmission coefficient.
Figure 11A:
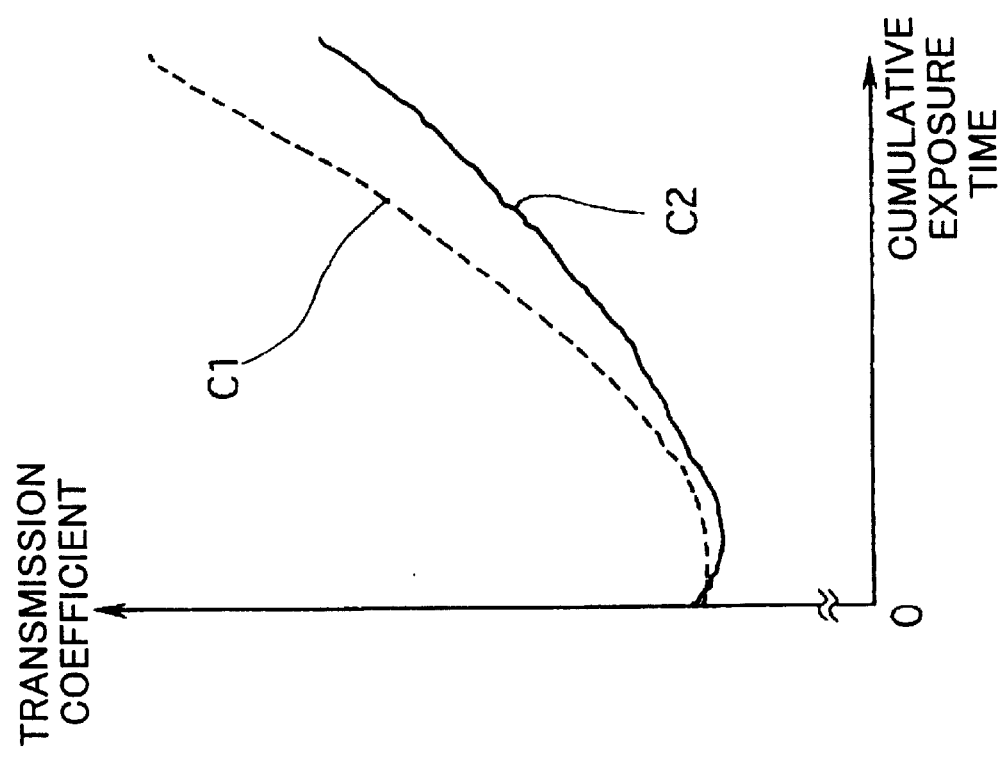

FIG. 11A is a graph of coefficient of transmission CT as a function of cumulative irradiation time t, in which curve C1 relates to actual change in transmission and curve C2 relates to predicted change stored in memory. When reproducibility of the original determination or transmission change is poor, curves C1 and C2 will divert as time progresses as shown in FIG. 11A.

However, in this embodiment, the coefficient of transmission CT is updated for each quick-mode alignment, so that the difference between the actual transmission and predicted transmission is small. FIG. 11B shows results from such a dynamic updating of the transmission coefficient as a function of irradiation time t. In FIG. 11B, curve C1 relates to actual change in transmission, and solid broken line C3 relates to a curve obtained by correcting the curve C2 shown in FIG. 11A with relevant parameters. The correction procedure is to measure transmission CT of the system PL at point in time t1, t2, . . . , t5, so that curve C2 in FIG. 11A is gradually corrected by adding a component of drift at each point to produce curve C3. Accordingly, by carrying out periodic checking of transmissivity of the system, prediction of transmission behavior between measurements can be improved significantly.

The interval of periodic transmission measurements should be changed according to the shape of the curve C1 which expresses actual transmission characteristics of the system PL. That is, in the interval near the point t4 where the change in the curve C1 is relatively large, measurements should be made at short intervals, for example, each time a wafer is exchanged, to renew the transmission factor CT, and in the interval near point t1 where the change in the curve C1 is relatively small, measurements may be extended longer, for example, every two wafer exchange. This type of scheduling would prevent serious productivity loss.

Also, for determining the positions of reference marks 114D, 114H or measuring the transmission coefficient of the projection system PL, it may be considered that other detection light other than exposure light can be used. However, when the detection light for measuring transmission characteristics is different than the illumination light for exposure, because the number of openings for the detection light (σ value as coherence factor) is not the same as the number of openings for the illumination light (σ value), measured transmission coefficients obtained under detection light and illumination light could be different. Also, there may be insufficient number of openings for the measurement system for measuring transmission coefficient and the like, while in this embodiment, exposure light IL can be used directly as detection light so that positional deviation of the target marks and transmission coefficient of the projection system PL can be determined with high precision.

Also, in order to change illuminance (accumulated quantity of light) depending on the transmissivity of a system, controls may be exercised on parameters other than the output power of the excimer laser source 2 (pulse energy), oscillation frequency and variable optical power mechanism, for example, the width in the scanning direction of the exposure region 16 in the projection system PL (width of the blind aperture in the illumination aperture system 11) or wafer scanning speed. In other words, it is sufficient to control any one of the illumination parameters of the illumination light IL radiating on the wafer W, i.e., pulse energy, pulse oscillation frequency, width in the scanning direction in the exposure region 16, and scanning speed of the wafer W.

Also, in FIG. 10A, by moving the window section 105 with pinholes to traverse the exposure region 16 in y-direction and integrating the detection signals from photodetector 112 at various x-locations, it is possible to predict a cumulative exposure quantity at each point on the wafer W. By adjusting the shape of fixed blind in the FOV illumination aperture 11 so that the cumulative exposure becomes constant at each point, it is possible to correct non-uniformity of illumination caused by change in transmissivity of the projection system PL brought about by the use of harmful illumination light IL.

Further, the main control device 7 is able to determine the degree of change in the focusing properties caused by transmissivity change in the projection system PL, on the basis of such parameters as positional deviation in reticle mark image detected by the reticle alignment system 30 and the reticle alignment device 31 and contrast in the reticle mark image. Main control device 7 maintains focusing properties of the projection system PL at a constant level by controlling the focusing correction device 51 (refer to FIG. 2) so as to nullify the changes in focusing properties. Focusing properties that can be detected in this case include at least one of magnification error, distortion, focus point, astigmatic aberration, coma aberration, image curvature, spherical aberration. Also, changes in focus point and image curvature can be adjusted by changing the height or orientation of the sample pedestal 21 (for wafer W) by operating the focus/tilt control device 27.

The off-axis type wafer alignment sensor 28 is an imaging type (Fixed Image Alignment method), but other methods such as laser-step-alignment (Laser Step Alignment method) in which slit shape laser beam scans dot wafer marks, diffraction grating type wafer marks are irradiated with interruptable two luminous dosees and determining the position of the marks using a pair of diffracted beams diffracted from the grating in a certain direction (Luminous Intensity Alignment method) may also be used. Also, in the above embodiment, focusing properties are corrected by using optics within the projection system PL, but same may be achieved by using changing the inter-ocular pressure or temperature changes in the projection system PL.

Also, although the shape of the illumination region 15 on the reticle R is rectangle, but an arc shape is also applicable. However, the advantage of a rectangular shape is that, in this embodiment, shapes of the illumination region 15 and the effective field-of-view illumination (covering the regions 15) and the pattern region on the reticle R are all rectangular, therefore the scanning distance for the reticle R is short. Further, the above embodiment is based on applying the present invention to a step-and-scan type projection exposure apparatus, but the invention is not limited such an apparatus. It is obvious that a stationary type step-and-repeat apparatus can also benefit from the present invention. Projection system PL need not be limited to the reflective diffraction type, and all diffractive or reflective type optics are applicable.

Furthermore, in the above embodiment, the measurement of the transmission coefficient of the projection system PL is performed while simultaneously detecting the mark on the reticle R and the reference mark of the referencing member FM by the reticle alignment system 30. However, the present invention is also applicable not only to the reticle alignment system 30 but also to various optical sensors which use an illumination beam IL for performing measurement. For example, the present invention can be applied to a pattern detecting system which irradiates exposure light on a mark provided on a reticle, and which detects, using a photoelectric detector, an image of the mark projected through a projection optical system and a patterned opening provided on a wafer stage. In such a pattern detecting system, it is desirable to provide the window section 105 shown in FIG. 9 adjacent to the patterned opening. The pattern detecting system can be used for measurement of the focal position of the projecting optical system, projection magnification, distortion, astigmatism, curvature of an image plane and the like.

In order to manufacture the projection exposure apparatus shown in FIG. 1, firstly, an illumination optical system and an optical projection system are installed in an exposure apparatus body and are optically adjusted, secondly, a reticle stage and a wafer stage are installed in the exposure apparatus body and wiring and pipe-laying are performed therebetween, thirdly, general adjustments of the apparatus, including electrical adjustments and validation test, are performed. The manufacturing of the projection exposure apparatus is desirably carried out in a clean room in which temperature, cleanliness, etc., are controlled.

Semiconductor devices are manufactured by a process including the steps of designing the function and the performance of the devices, manufacturing reticles in accordance with the resulted design of the devices, producing wafers from a silicon material, transferring patterns of the reticles onto the wafers using the projection exposure apparatus described above, assembling the devices (this step includes dicing steps, bonding steps, and packaging steps), and checking the produced devices.

Accordingly, the present invention can be modified in many different ways within the scope of the basic invention.

What is claimed is:

1. A projection exposure apparatus comprising:
   an illumination optical system which emits an energy beam and illuminates a pattern formed on a mask;
   a projection optical system which projects an image of said pattern onto a substrate;
   a substrate stage disposed at a side of an image plane of said projection optical system to position said substrate;
   a beam energy measuring system which measures energy of said energy beam input in said projection optical system;
   a referencing member which is disposed on said substrate stage having at least one reference mark to correspond with at least one alignment mark formed on said mask;
   an alignment sensor which detects a positional deviation between the alignment mark on said mask and said reference mark under illumination by said energy beam;
   a detector device which detects energy of said energy beam which has passed through said projection optical system when said reference mark is illuminated by said energy beam; and
   a computation system connected to said beam energy measuring system and to said detector device to compute a transmission coefficient of said projection optical system, according to a result output from said beam energy measuring system and a detection result output from said detector device.

2. An apparatus according to claim 1, wherein said illumination optical system emits an energy beam of wavelengths in an ultraviolet region.

3. An apparatus according to claim 1, wherein said energy beam is comprised by light pulses having wavelengths of not more than 200 nm, and said apparatus is provided with a mask stage disposed at a side of an object plane of said projection optical system to move said mask, and, in order to project said image of said pattern onto said substrate, said substrate and said mask are moved relative to said projection optical system by translating said substrate stage synchronously with said mask stage.

4. An apparatus according to claim 1, wherein said illumination optical system comprises a wideband laser source whose full-width-half-maximum (FWHM) value is made to be wider than 100 pico-meter (pm).

5. An apparatus according to claim 1, further comprising a light quantity control system connected to said detector device to control an accumulated value of said energy beam radiated on said substrate from said illumination optical system through said projection optical system, according to the result output from said detector device.

6. An apparatus according to claim 5, wherein said light quantity control system comprises a storage section which stores illumination history records which are relationships between illumination time and change of a transmission coefficient of said projection optical system, and a transmission coefficient forecasting section which forecasts the transmission coefficient of said projection optical system according to the output from said detector device and said illumination history records; and said light quantity control system controlling said accumulated value based on the forecasted transmission coefficient.

7. A method for using an exposure apparatus of claim 1, comprising:
   detecting a positional deviation of said alignment marks on said mask with respect to said reference marks by said alignment sensor under the illumination by said energy beam; and detecting the strength of said energy beam using said detector device while detecting said positional deviation in a substantially concurrent manner.

8. An exposure apparatus according to claim 1, wherein said detector device comprises a window portion provided in said referencing member, and a light receiving section which receives said energy beam having passed through said window portion.

9. An apparatus according to claim 8, wherein said window portion is an opening.

10. An apparatus according to claim 1, further comprising:

at least one optical element, between said beam energy measuring system and said mask, which constitutes said illumination optical system, wherein
a transmission coefficient of said projection optical system includes a transmission coefficient of said at least one optical element.

11. A projection exposure apparatus comprising:

an illumination optical system which emits an energy beam and illuminates a pattern formed on a mask;

a projection optical system which projects an image of said pattern onto a substrate;

a substrate stage disposed at a side of an image plane of said projection optical system to position said substrate;

a referencing member disposed on said substrate stage having at least one reference mark to correspond with at least one alignment mark formed on said mask;

an alignment sensor which detects a positional deviation between the alignment mark on said mask and said reference mark under illumination by said energy beam;

a detector device which detects energy of said energy beam which has passed through said projection optical system when said reference mark is illuminated by said energy beam; and a light quantity control system connected to said detector device to control accumulated light quantity of said energy beam radiated on said substrate from said illumination optical system through said projection optical system, according to a result output from said detector device.

12. An apparatus according to claim 11, wherein said illumination optical system emits an energy beam of wavelengths in an ultraviolet region.

13. An apparatus according to claim 11, wherein said energy beam is comprised by light pulses having wavelengths of not more than 200 nm, and said apparatus is provided with a mask stage which moves said mask, and, in order to project said image of said pattern onto said substrate, said substrate and said mask are moved relative to said projection optical system by translating said substrate stage synchronously with said mask stage.

14. An apparatus according to claim 11, wherein said light quantity control system comprises a storage section which stores illumination history records which are relationships between illumination time and change of transmission coefficient of said projection optical system, and a transmission coefficient forecasting section which forecasts the transmission coefficient of said projection optical system according to the output from said detector device and said illumination history records; and said light quantity control system controlling said accumulated light quantity based on the forecasted transmission coefficient.

15. A method for using an exposure apparatus of claim 11, comprising:

detecting a positional deviation of said alignment marks on said mask with respect to said reference marks by said alignment sensor under the illumination by said energy beam; and detecting the strength of said energy beam using said detector device while detecting said positional deviation in a substantially concurrent manner.

16. An exposure apparatus according to claim 11, wherein said detector device comprises a window portion provided in said referencing member, and a light receiving section which receives said energy beam having passed through said window portion.

17. An apparatus according to claim 11, further comprising:

a beam energy measuring system which is arranged on a light path of said energy beam and which detects energy of said energy beam prior to being incident on said projection optical system, wherein
said control system controls a light quantity of said energy beam radiated on said substrate based on an output from said detector device and an output from said beam energy measuring system.

18. A projection exposure apparatus which exposes a substrate with an illumination light through a mask, comprising:

a projection optical system disposed between said mask and said substrate to irradiate said illumination light onto said substrate;

an illumination optical system, disposed on an optical path of said illumination light, to irradiate said illumination light on said mask;

a pattern detecting system which irradiates said illumination light on a measurement pattern and which receives said illumination light through said projection optical system;

a first detector disposed at a side of an image plane of said projection optical system to receive said illumination light through said projection optical system when said measurement pattern is irradiated by said illumination light; and a computation system connected to said first detector to compute a transmission coefficient of said projection optical system according to a result output from said first detector.

19. An apparatus according to claim 18, further comprising a stage disposed at a side of the image plane of said projection optical system so as to shift said substrate relative to said projection optical system, and wherein a light receiving surface of said first detector is arranged on said stage.

20. An apparatus according to claim 19, wherein said measurement pattern is provided on said stage, and said illumination light passing through said projection optical system is irradiated on said measurement pattern.

21. An apparatus according to claim 18, further comprising a second detector disposed on the light path of said illumination optical system to detect a part of said illumination light irradiating said mask through said illumination optical system, and wherein said computation system computes said transmission coefficient of said projection optical system according to outputs from said first and second detectors.

22. An apparatus according to claim 21, further comprising an exposure controller connected to said computation system and said second detector to control an accumulated value of said illumination light irradiated on said substrate at a predetermined dose of exposure.

23. An apparatus according to claim 21, further comprising:
at least one optical element, between said second detector and said mask, which constitutes said illumination optical system, wherein
a transmission coefficient of said projection optical system includes a transmission coefficient of said at least one optical element.

24. A projection exposure apparatus which exposes a substrate with an illumination light through a mask, comprising:
an illumination optical system which is disposed in a light path of said illumination light and which illuminates said mask;
a projection optical system disposed between said mask and said substrate to irradiate said illumination light onto said substrate;
a stage having a measurement pattern thereon and disposed on a side of an image plane of said projection optical system;
a first detector having a light receiving portion disposed together with said measurement pattern in an irradiated region of said illumination light formed through said projection optical system;
a second detector which is disposed in said illumination optical system and which receives a part of said illumination light; and
a computation system which is connected to said first detector and said second detector and which computes a ratio of an output result of said first detector to an output result of said second detector, when said measurement pattern is irradiated.

25. An apparatus according to claim 24, wherein said light receiving surface is a window portion which allows said illumination light to pass through said stage, and said first detector comprises a light receiving element and a transmission optical system provided between said window portion and said light receiving element.

26. An apparatus according to claim 24, wherein a ratio of an output result of said first detector to an output result of said second detector is a transmission coefficient of said projection optical system.

27. An apparatus according to claim 26, further comprising:
at least one optical element, between said second detector and said mask, which constitutes said illumination optical system, wherein
a transmission coefficient of said projection optical system includes a transmission coefficient of said at least one optical element.

28. An apparatus according to claim 24, further comprising:
an alignment mark which is arranged at a side of a body plane of said projection optical system; and
an alignment sensor which measures a positional deviation between said measurement pattern and said alignment mark.

29. An apparatus according to claim 24, wherein said light receiving portion of said first detector is provided at said stage.

30. An apparatus according to claim 29, wherein when said mask or said substrate is exchanged, said measurement pattern is irradiated by said illumination light.

31. A method for exposing a substrate with an illumination light irradiated through a projection optical system and a mask, comprising the steps of:
providing a measurement pattern and a light receiving surface of a first light receiver at a side of an image plane of said projection optical system;
providing a second light receiver which receives a part of said illumination light at a side of a body plane of said projection optical system;
irradiating said illumination light on a region including said measurement pattern and said light receiving surface of said first light receiver through said projection optical system; and
determining a ratio of an output from said first light receiver to an output from said second light receiver, when said measurement pattern is irradiated with said illumination light.

32. A method according to claim 31, wherein a ratio of said first light receiver to said second light receiver is a transmission coefficient of said projection optical system.

33. A method according to claim 32, further comprising the steps of:
correcting said computed transmission coefficient according to a relation of a transmission coefficient of said projection optical system and an irradiated amount of said illumination light; and
controlling an accumulated amount of said illumination light on said substrate according to said corrected transmission coefficient and an output of said second light receiver.

34. A method according to claim 31, further comprising the step of controlling an accumulated amount of said illumination light on said substrate according to an output of said second light receiver and to a ratio of an output of said first light receiver to an output of said second light receiver.

35. A method according to claim 34, further comprising the steps of:
moving said mask and said substrate in a synchronous manner in order to transfer a pattern on said mask onto said substrate; and
controlling the accumulated value of said illumination light irradiated on said substrate at the predetermined dose of exposure, by controlling at least one of said energy of said illumination light, pulse oscillation frequency of said illumination light, beam-width of said illumination light in a direction along which said substrate moves, and speed of said movement of said mask and said substrate.

36. A method for manufacturing a projection exposure apparatus for exposing substrates with an illumination light through a mask, comprising the steps of:
providing, in a light path of said illumination light, an illumination optical system which illuminates said mask;
providing, between said mask and said substrate, a projection optical system which irradiates said illumination light on said substrate;
providing, at a side of an image plane of said projection optical system, a stage which holds said substrate;
providing a measurement pattern on said stage;
providing a first detector having a light receiving portion disposed together with said measurement pattern in a region on said stage irradiated by said illumination light;
providing a second detector which detects a part of said illumination light in said illumination optical system; and providing a computation system connected to said first detector and said second detector which computes a ratio of an output result of said first detector to an output result of said second detector which are output when said illumination light is irradiated on said measurement pattern.

37. An exposure apparatus that exposes a substrate with an energy beam through a mask, the exposure apparatus comprising:

a projection optical system disposed between said mask and said substrate to irradiate said energy beam onto said substrate;

an illumination optical system disposed on an illumination path of said energy beam to irradiate said energy beam onto said mask;

a measurement pattern arranged in a region irradiated by said energy beam through said projection optical system;

a first detector that receives said energy beam which has passed through said projection optical system, and that is arranged in said region together with said measurement pattern;

a second detector arranged in said illumination optical system which detects a part of said energy beam; and a computation system connected to said first detector and said second detector which computes a ratio of an output from said first detector to an output from said second detector, when said illumination light is irradiated on said measurement pattern.

38. An apparatus according to claim 37, further comprising:

a stage disposed at a side of an image plane of said projection optical system to hold said substrate;

wherein said first detector comprises an energy beam receiving surface which receives said energy beam, and said measurement pattern and said energy beam receiving surface are formed on said stage.

39. An apparatus according to claim 38, wherein said energy beam receiving surface is a part of a detector, and said energy beam receiving surface includes a window portion which allows said energy beam to pass through said stage.

40. An apparatus according to claim 39, wherein said computation system computes a transmission coefficient of said projection optical system according to a ratio of an output of said first detector to an output of said second detector.

41. An apparatus according to claim 40, further comprising a control system connected to said second detector to control an accumulated exposure amount of said energy beam radiated on said substrate, according to an output from said second detector.

42. An apparatus according to claim 38, wherein said measurement pattern has a first pattern and a second pattern, and said energy beam receiving surface is disposed between said first pattern and said second pattern.

43. A method of exposing a substrate through a projection optical system with an exposure light irradiated on a mask, comprising:

illuminating a mark arranged at a side of a body plane of said projection optical system with said exposure light;

computing a ratio of a part of energy of said exposure light prior to being incident on said projection optical system to a part of energy of said exposure light after passing through said projection optical system; and controlling accumulated energy of said exposure light illuminated on said substrate based on a value of said computed ratio and a part of said exposure light received prior to being incident on said projection optical system.

44. A method according to claim 43, wherein said mark is formed on said mask.

45. A method according to claim 44, further comprising:

illuminating a mark formed on another mask with said exposure light, when said mask is exchanged with said other mask.

46. A method according to claim 43, further comprising:

irradiating an alignment mark arranged at a side of an image plane of said projection optical system through said projection optical system, when said exposure light is irradiated on said mark.

47. A method according to claim 46, further comprising:

measuring a positional deviation between said mark and said alignment mark.

* * * * *